(12) United States Patent
Cheng et al.

(10) Patent No.: US 12,527,065 B2
(45) Date of Patent: Jan. 13, 2026

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Yuting Cheng, Taoyuan (TW); Kuan-Kan Hu, Hsinchu (TW); Tzu Pei Chen, Taipei (TW); Chia-Hung Chu, Taipei (TW); Po-Chin Chang, Taichung (TW); Sung-Li Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 379 days.

(21) Appl. No.: 18/342,918

(22) Filed: Jun. 28, 2023

(65) Prior Publication Data

US 2025/0006803 A1 Jan. 2, 2025

(51) Int. Cl.
*H10D 84/01* (2025.01)
*H10D 30/01* (2025.01)
(Continued)

(52) U.S. Cl.
CPC ..... *H10D 84/0149* (2025.01); *H10D 30/0198* (2025.01); *H10D 30/6735* (2025.01);
(Continued)

(58) Field of Classification Search
CPC .... H10D 30/01; H10D 30/014; H10D 30/019; H10D 30/0198; H10D 30/024; H10D 30/0241; H10D 30/0273; H10D 30/031; H10D 30/0321; H10D 30/0323; H10D 30/0327; H10D 30/501–509; H10D 30/6735; H10D 62/121; H10D 64/017; H10D 64/251; H10D 64/254; H10D 64/256; H10D 64/257; H10D 84/01; H10D 84/0149; H10D 84/0186; H10D 84/02; H10D 84/032; H10D 84/035; H10D 84/038; H10D 84/05; H10D 84/07; H10D 84/08;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Cheung Lee
(74) *Attorney, Agent, or Firm* — Birch, Stewart, Kolasch & Birch, LLP

(57) ABSTRACT

A method includes forming a first transistor over a substrate, in which the first transistor includes first source/drain epitaxy structures; forming a second transistor over the first transistor, in which the second transistor includes second source/drain epitaxy structures; forming an opening extending through one of the second source/drain epitaxy structures and exposing a top surface of one of the first source/drain epitaxy structures; performing a first deposition process to form a first metal in the opening, in which a first void is formed in the first metal during the first deposition process; performing a first etching back process to the first metal until the first void is absent; and performing a second deposition process to form a second metal in the opening and over the first metal.

20 Claims, 31 Drawing Sheets

(51) Int. Cl.
*H10D 30/67* (2025.01)
*H10D 62/10* (2025.01)
*H10D 64/23* (2025.01)
*H10D 84/03* (2025.01)
*H10D 84/83* (2025.01)

(52) U.S. Cl.
CPC ......... *H10D 62/121* (2025.01); *H10D 64/251* (2025.01); *H10D 84/038* (2025.01); *H10D 84/83* (2025.01)

(58) Field of Classification Search
CPC ............... H10D 84/83; H10D 84/8311; H10D 84/8312; H10D 84/83125; H10D 84/83135; H10D 84/83138; H10D 84/8314; H10D 84/8316; H10D 84/832–833; H10D 84/834; H10D 84/835; H10D 84/836; H10D 84/837–839; H10D 88/00; H10D 88/01
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,069,684 B1 * | 7/2021 | Xie ................... H01L 21/02603 |

* cited by examiner

SEMICONDUCTOR DEVICE AND METHOD FOR FORMING THE SAME

BACKGROUND

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other. While existing C-FET structures are generally adequate, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
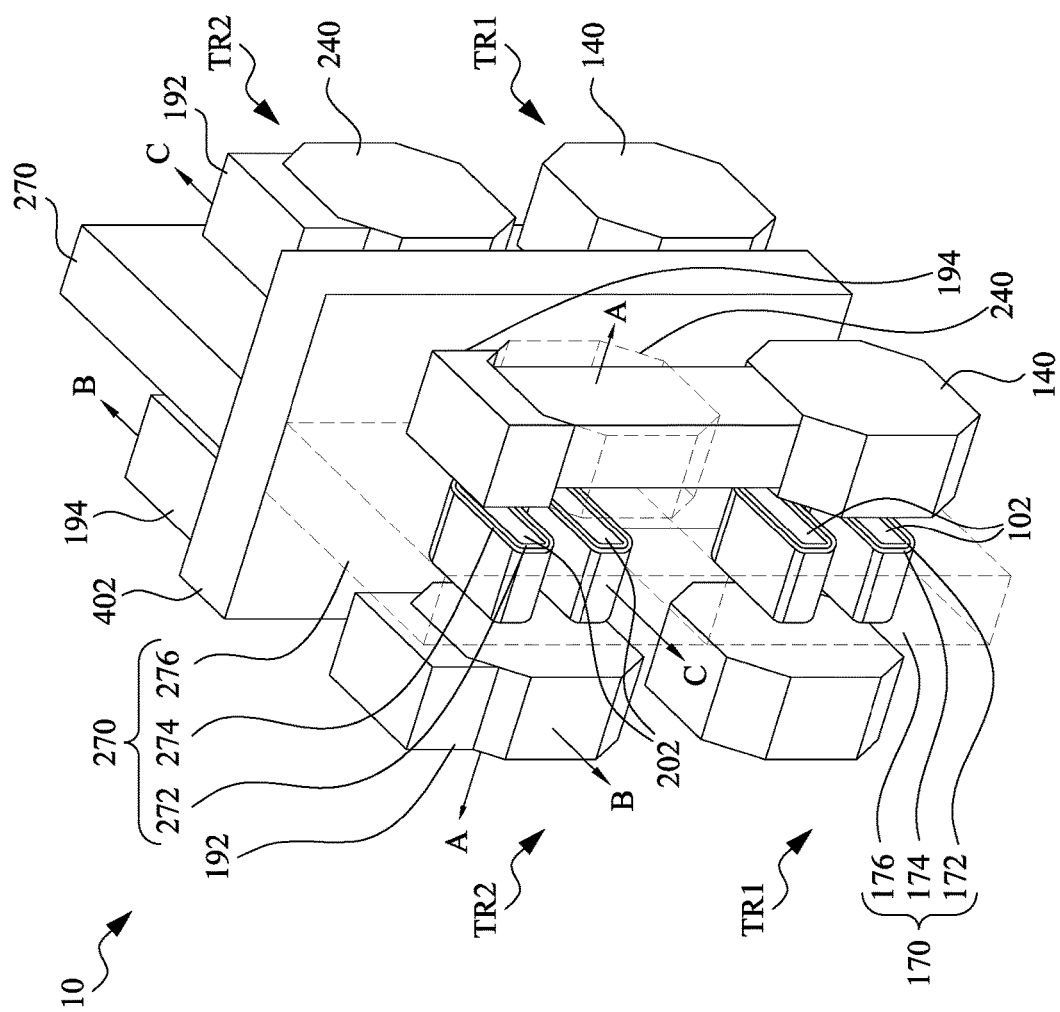
FIG. 1 is a perspective view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a perspective view of a semiconductor device in accordance with some embodiments of the present disclosure. In the present disclosure, a complementary FET (CFET) 10 is provided, and its manufacturing method will be disclosed in the following discussion. In a CFET 10, first transistors TR1 are disposed over a substrate (not shown), and second transistors TR2 are disposed vertically above the respective first transistors TR1. In some embodiments, the first transistors TR1 and the second transistors TR2 each may be field effect transistor (FET) and may both include gate-all-around (GAA) configuration, and thus the first transistors TR1 and the second transistors TR2 can also be referred to as GAA FETs. Each of the first transistors TR1 includes first semiconductor channel layers 102 vertically stacked one above another, a first metal gate structure 170 wrapping around each of the first semiconductor channel layers 102, and first source/drain epitaxy structures 140 on opposite ends of each of the first semiconductor channel layers 102. Similarly, each of the second transistors TR2 includes second semiconductor channel layers 202 vertically stacked one above another, a second metal gate structure 270 wrapping around each of the second semiconductor channel layers 202, and second source/drain epitaxy structures 240 on opposite ends of each of the second semiconductor channel layers 202. The first metal gate structure 170 may include an interfacial layer 172, a gate dielectric layer 174, and a gate electrode 176. Similarly, the second metal gate structure 270 may include an interfacial layer 272, a gate dielectric layer 274, and a gate electrode 276. In some embodiments, each of the first transistors TR1 has a first conductivity type (e.g., p-type) and each of the second transistors TR2 has a second conductivity type (e.g., n-type) different from the first conductivity type. In some embodiments, the first transistors TR1 can be referred to as P-FETs, and the second transistors TR2 can be referred to as N-FETs.

A dielectric structure 402 is disposed between two adjacent first transistors TR1, so as to electrically isolate the two adjacent first transistors TR1. Similarly, the dielectric structure 402 is disposed between two adjacent second transistors TR2, so as to electrically isolate the two adjacent second transistors TR2.

The CFET 10 further includes source/drain contacts 192 and 194. The source/drain contacts 192 and 194 are disposed over the respective second source/drain epitaxy structures 240. In some embodiments, the source/drain contact 192 is in contact with top surface of the corresponding second source/drain epitaxy structure 240. On the other hand, the source/drain contact 194 may penetrate through the second source/drain epitaxy structure 240, and extends downwardly to top surface of the corresponding first source/drain epitaxy structure 140. As a result, the source/drain contact 194 electrically connects the second source/drain epitaxy structure 240 and the underlying first source/drain epitaxy structure 140.

During forming the source/drain contact 194, an opening may be formed penetrate through the second source/drain epitaxy structure 240, and extends downwardly to top surface of the corresponding first source/drain epitaxy structure 140. However, serious merge void issue may happen within the high aspect ratio opening, because metal may early merge on narrow side of the opening during metal gap fill process. To address this issue, embodiments of the present disclosure provide a method by cyclically performing a deposition-etch-deposition process to form a source/drain contact in the opening. The deposition-etch-deposition process allows the source/drain contact being formed, layer-by-layer, in a high aspect ratio opening through a bottom-up manner, which will improve the gap fill capability and may achieve a void-free gap filling process.

FIGS. 2A to 13B illustrate a method in various stages of forming a semiconductor device in accordance with some embodiments of the present disclosure. It is noted that FIGS. 2A, 3A, 4A, 5A, 6A, 7A, 8A, 9A, 10A, 11A, 12A, and 13A include cross-sectional views the same as the cross-sectional view along line A-A of FIG. 1. FIGS. 2B, 3B, 4B, 5B, 6B, 7B, 8B, 9B, 10B, 11B, 12B, and 13B include cross-sectional views the same as the cross-sectional view along line B-B of FIG. 1. FIGS. 4C, 7C, and 8C include cross-sectional views the same as the cross-sectional view along line C-C of FIG. 1. Although FIGS. 2A to 13B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. It is noted that some elements of FIGS. 2A to 13B may be similar to those described with respect to FIG. 1, and thus relevant details will not be repeated for brevity.

Figure 2A:
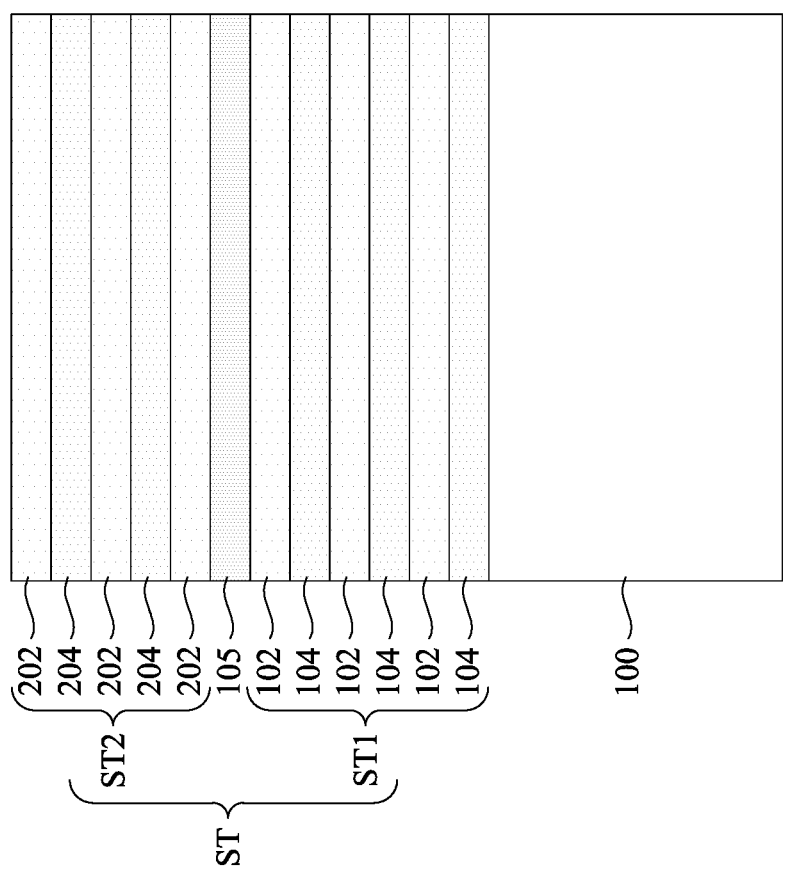
FIGS. 2A to 13B illustrate a method in various stages of forming a semiconductor device in accordance with some embodiments of the present disclosure.
Figure 2B:
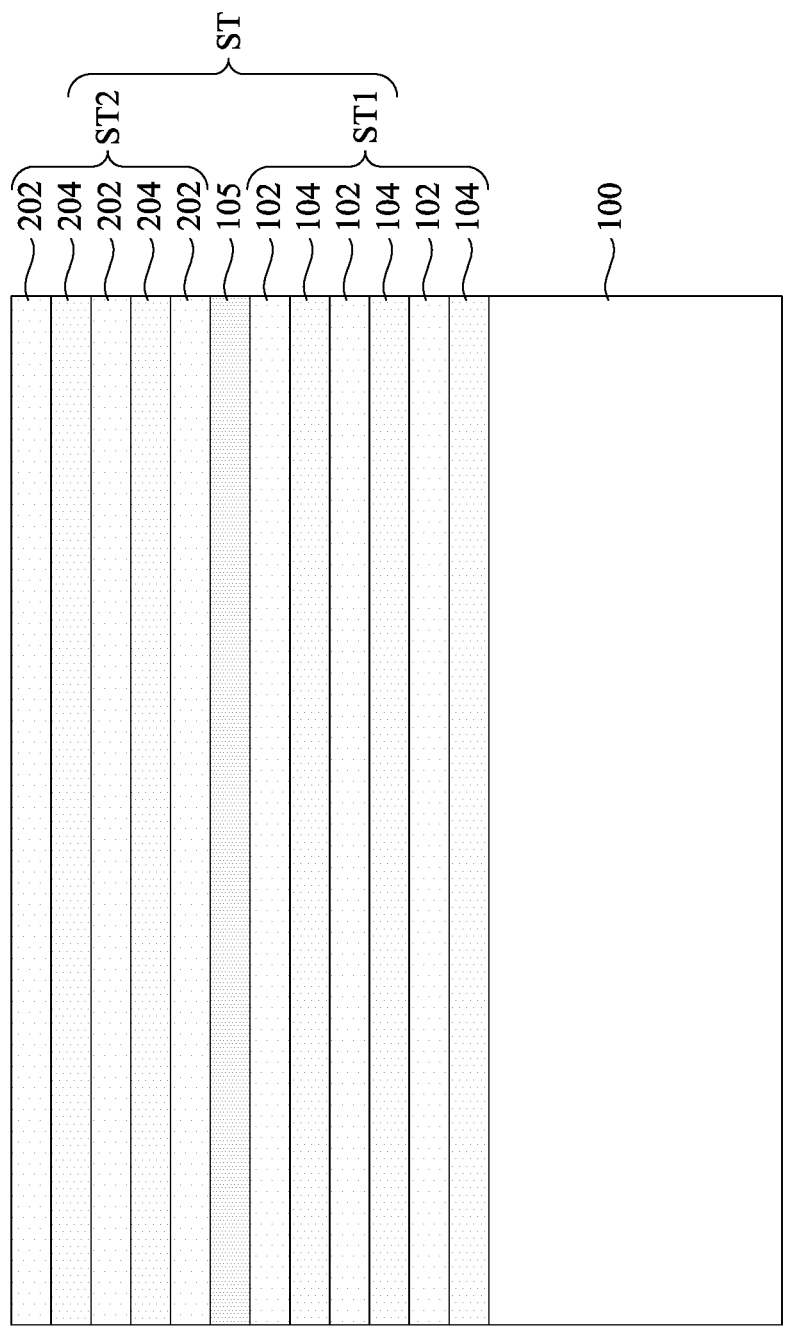

Reference is made to FIGS. 2A and 2B. Shown there is a substrate 100. Generally, the substrate 100 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

A semiconductor stack ST is formed over the substrate 100. The semiconductor stack ST includes a first stack ST1 of alternating semiconductor layers 102 and 104, a semiconductor layer 105 disposed over the first stack ST1, and a second stack ST2 of alternating semiconductor layers 202 and 204 over the semiconductor layer 105. In some embodiments, the semiconductor layers 102 and 202 may be made of pure silicon layers that are free of germanium. The semiconductor layers 102 and 202 may also be substantially pure silicon layers, for example, with a germanium percentage lower than about 1 percent. The semiconductor layers 104, 105, and 204 may be made of silicon germanium, while the semiconductor layer 105 may include a higher germanium composition than the semiconductor layers 104 and 204. For example, the germanium percentage (atomic percentage concentration) of the semiconductor layer 105 is in a range from about 60 percent and about 80 percent, and the germanium percentage (atomic percentage concentration) of the semiconductor layers 104 and 204 is in a range from about 20 percent and about 40 percent. In some embodiments, the semiconductor layers 102, 104, 105, 202, and 204 may be deposited using suitable deposition process, such as selective epitaxial growth (SEG), chemical vapor deposition (CVD), molecular beam epitaxy (MBE), or other suitable process(es). In some embodiments, the semiconductor layers 104 and 204 may be removed during a replacement gate (RPG) process, and thus the semiconductor layers 104 and 204 can also be referred to as sacrificial layers.

Figure 3A:
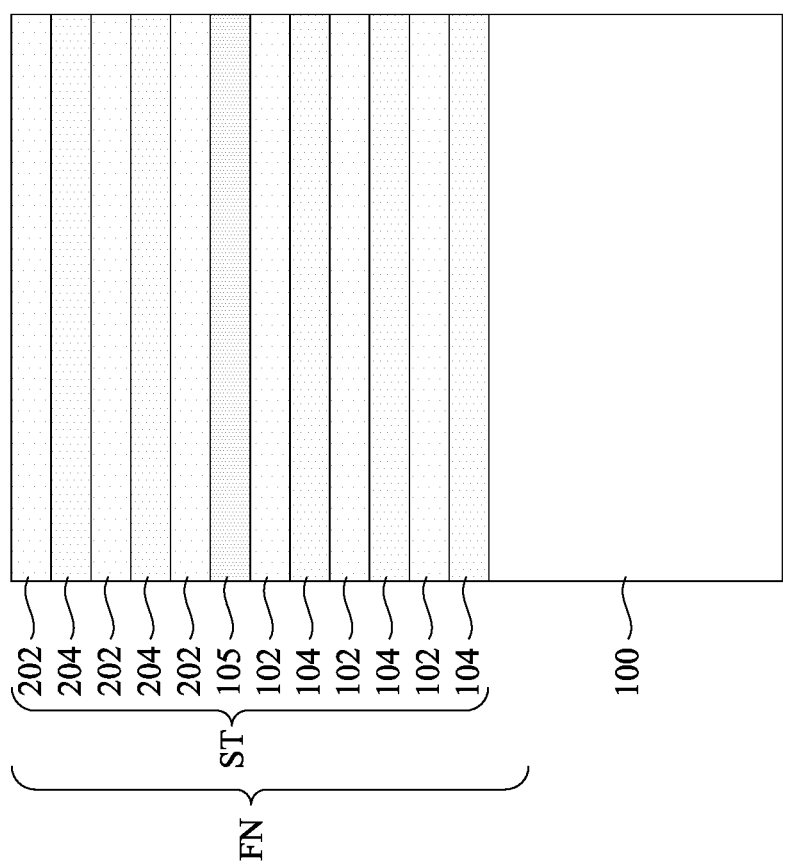
Figure 3B:
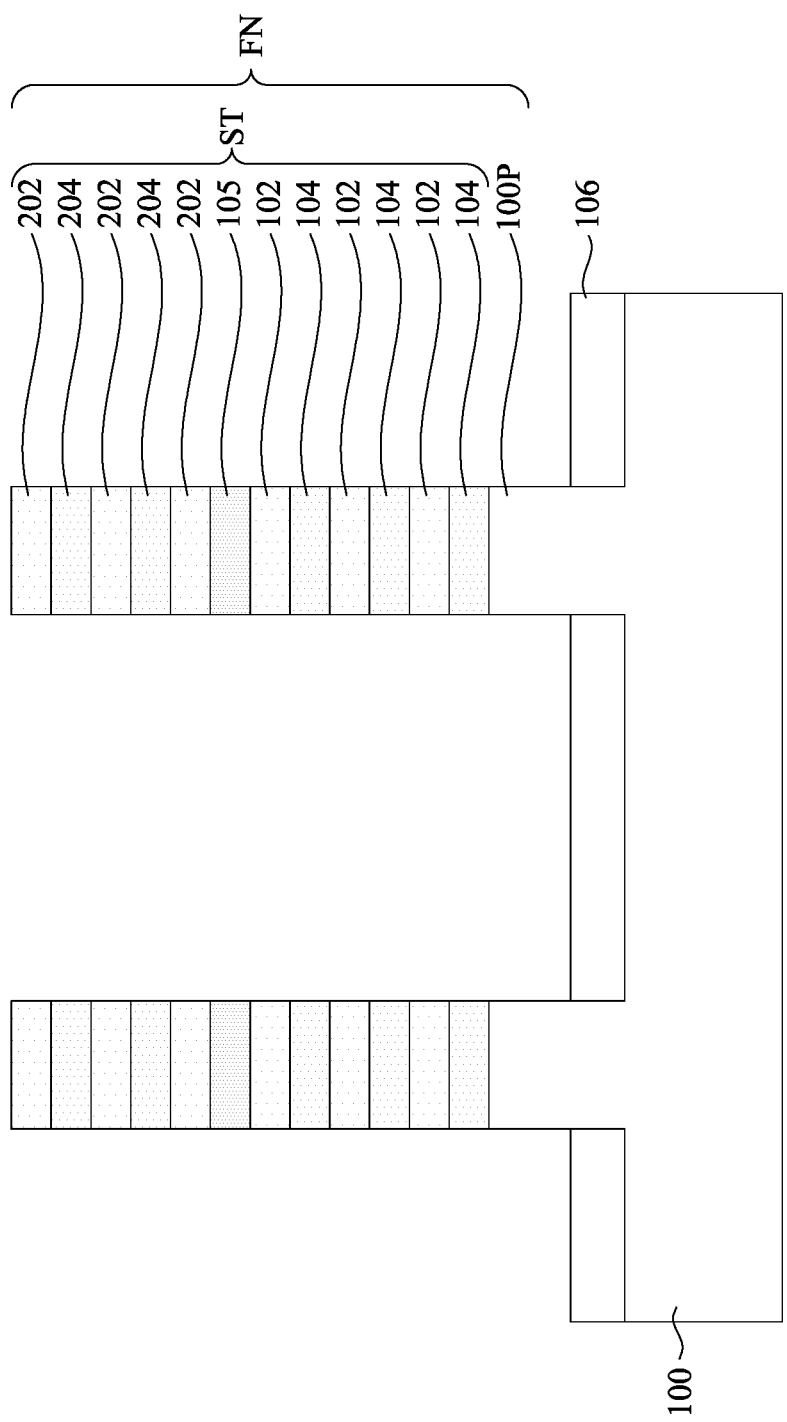

Reference is made to FIGS. 3A and 3B. A patterning process is performed to the semiconductor stack ST and the substrate 100 to form fin structures FN. In some embodiments, the patterning process may include forming a patterned photoresist layer over the stack ST, and then performing an etching process to remove unwanted portions of the semiconductor stack ST and the substrate 100 exposed by the patterned photoresist layer. Each of the fin structures FN may include a remaining portion of the semiconductor stack ST and a semiconductor strip 100P protruding over the substrate 100. In some embodiments, the etching process may include wet etch, dry etch, or the like.

After the fin structures FN are formed, isolation structures 106 are formed over the substrate 100 and laterally surrounding the fin structures FN. In some embodiments, the isolation structures 106 may be in contact with sidewalls of the semiconductor strip 100P of the substrate 100. The isolation structures 106 may be shallow trench isolation (STI) structures, suitable isolation structures, combinations of the foregoing, or the like. In some embodiments, the isolation structures 106 may be made of oxide (e.g., silicon oxide), nitride (e.g., silicon nitride), or combinations thereof.

Figure 4A:
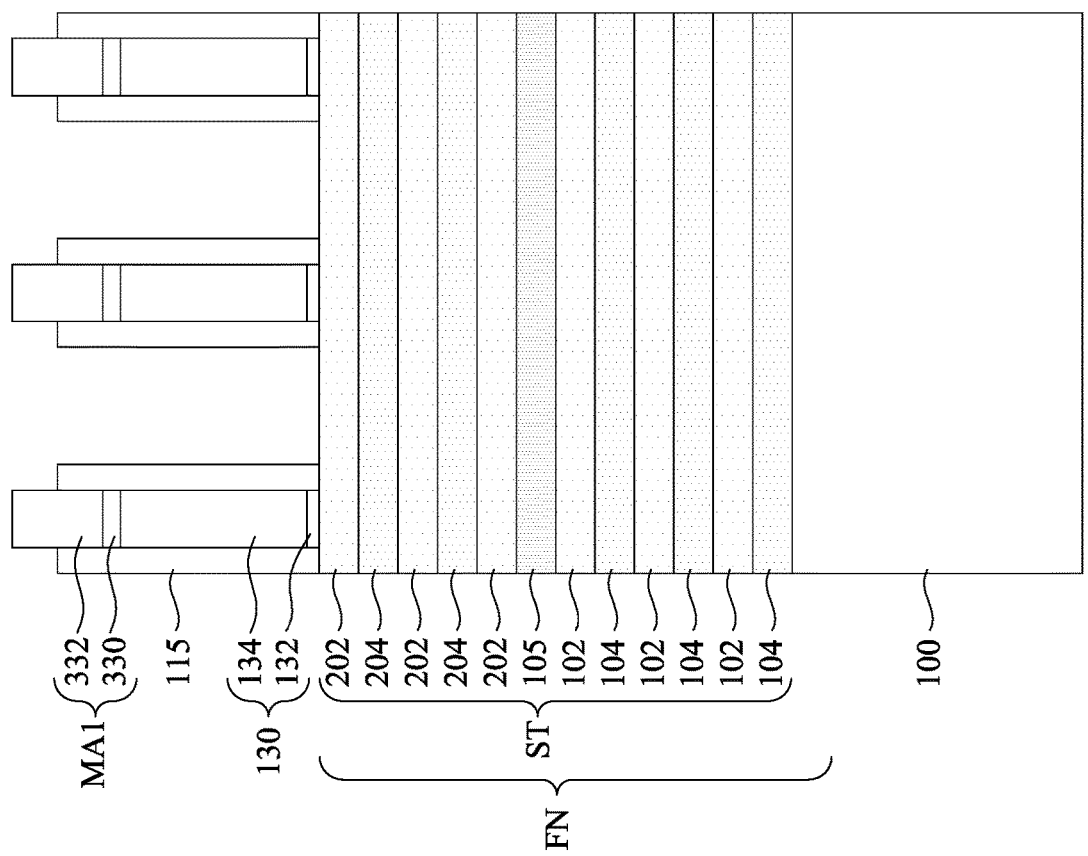
Figure 4B:
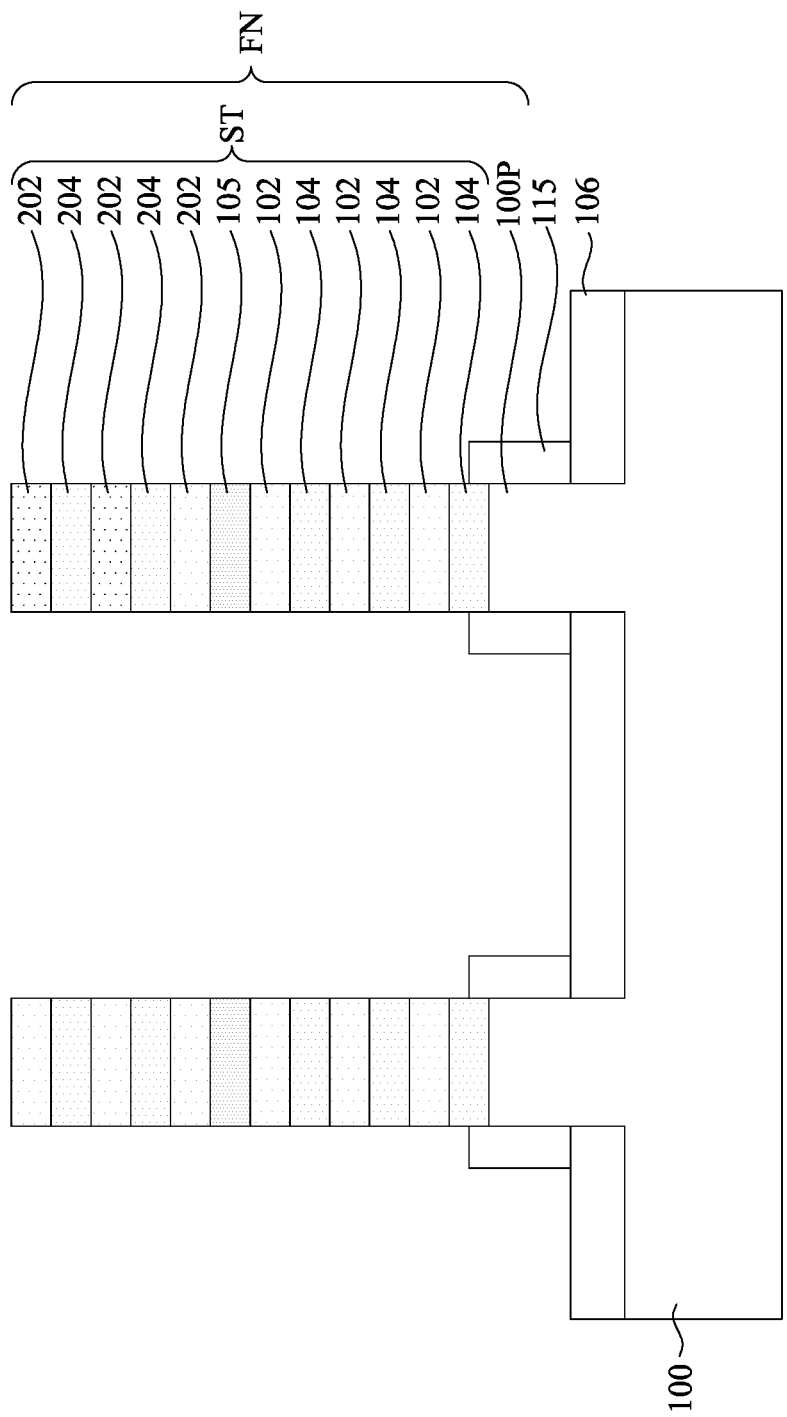
Figure 4C:
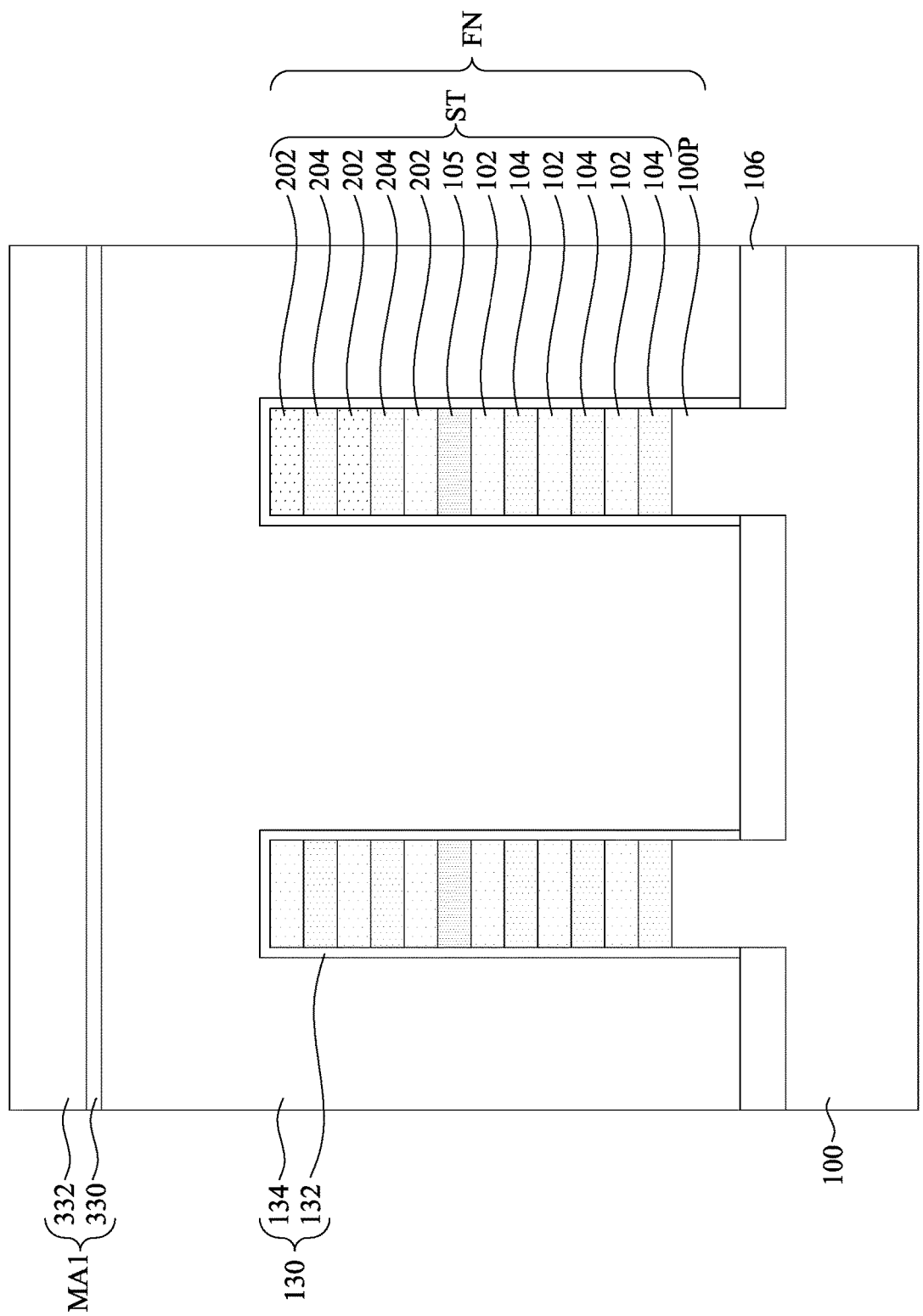

Reference is made to FIGS. 4A, 4B, and 4C. Dummy gate structures 130 are formed over the substrate 100 and crossing the fin structures FN (see FIG. 4C). In some embodiments, each of the dummy gate structures 130 includes a dummy gate dielectric 132 and a dummy gate electrode 134 over the dummy gate dielectric 132. The dummy gate dielectric 132 may be, for example, silicon oxide, silicon nitride, a combination thereof, or the like, and may be deposited or thermally grown according to acceptable techniques. The dummy gate electrode 134 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals.

The dummy gate electrode 134 and the dummy gate dielectric 132 may be formed by, for example, depositing a dummy dielectric layer and a dummy gate layer over the substrate 100, forming patterned masks MA1 over the dummy gate layer, and then performing an etching process to the dummy dielectric layer and the dummy gate layer by using the patterned masks MA1 as etch mask. In some embodiments, the dummy gate electrode 134 may be deposited by physical vapor deposition (PVD), chemical vapor deposition (CVD), sputter deposition, or other techniques for depositing the selected material. In some embodiments, the dummy gate dielectric 132 may be formed by thermal oxidation.

In some embodiments, each of the patterned masks MA1 includes a first hard mask 330 and a second hard mask 332 over the first hard mask 330. The first hard mask 330 and the second hard mask 332 may be made of different materials.

In some embodiments, the first hard mask 330 may be formed of silicon nitride, and the second hard mask 332 may be formed of silicon oxide.

Spacers 115 are formed on opposite sidewalls of each of the dummy gate structures 130 (see FIG. 4A), and on opposite sidewalls of the fin structures FN (see FIG. 4B). In some embodiments, portions of the spacers 115 on opposite sidewalls of each of the dummy gate structures 130 can be referred to as gate spacers, and portions of the spacers 115 on opposite sidewalls of the fin structures FN can be referred to as fin spacers. In some embodiments, the spacers 115 may be formed of silicon oxide, silicon nitride, silicon oxynitride, combinations thereof. In some embodiments, the spacers 115 may be formed by, for example, depositing a spacer layer blanket over the substrate, and then performing an anisotropic etching process to remove horizontal portions of the spacer layer, such that vertical portions of the spacer layer remain on sidewalls of the dummy gate structures 130 and on sidewalls of the fin structures FN. In some embodiments, the remaining vertical portions of the spacer layer can be referred to as the spacers 115. The spacer layer may be deposited using techniques such CVD, ALD, or the like.

Figure 5A:
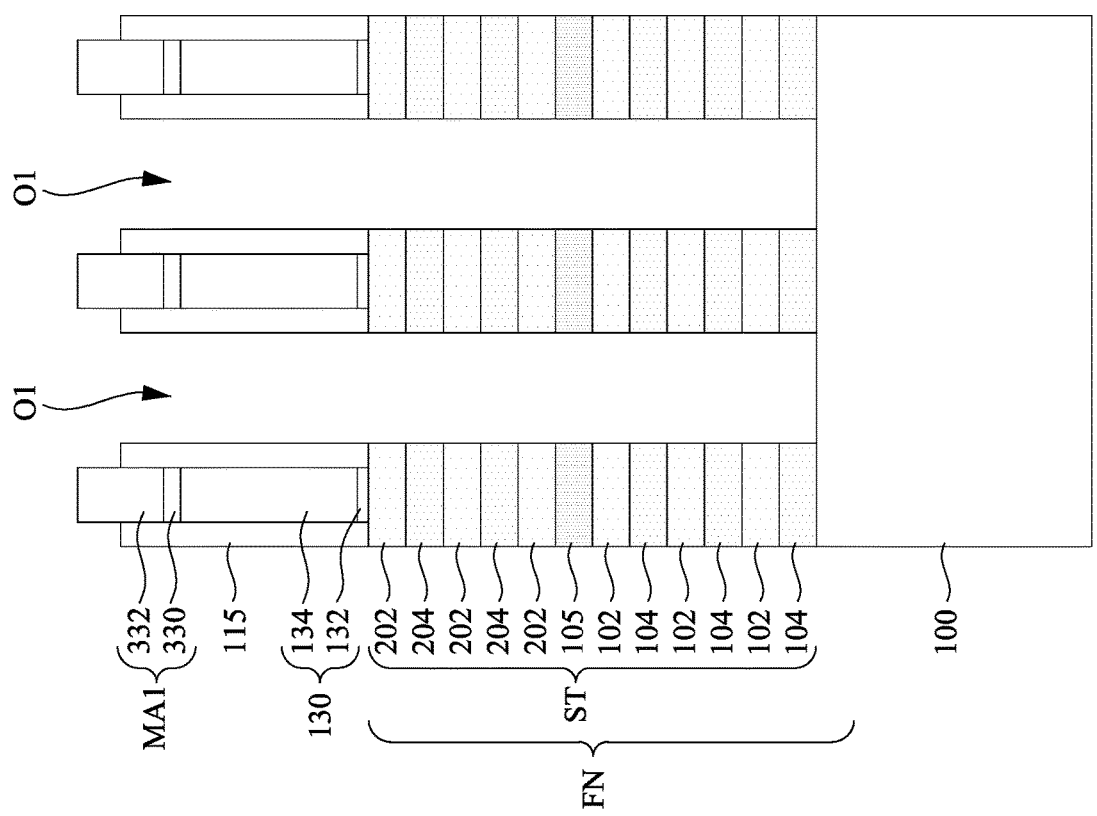
Figure 5B:
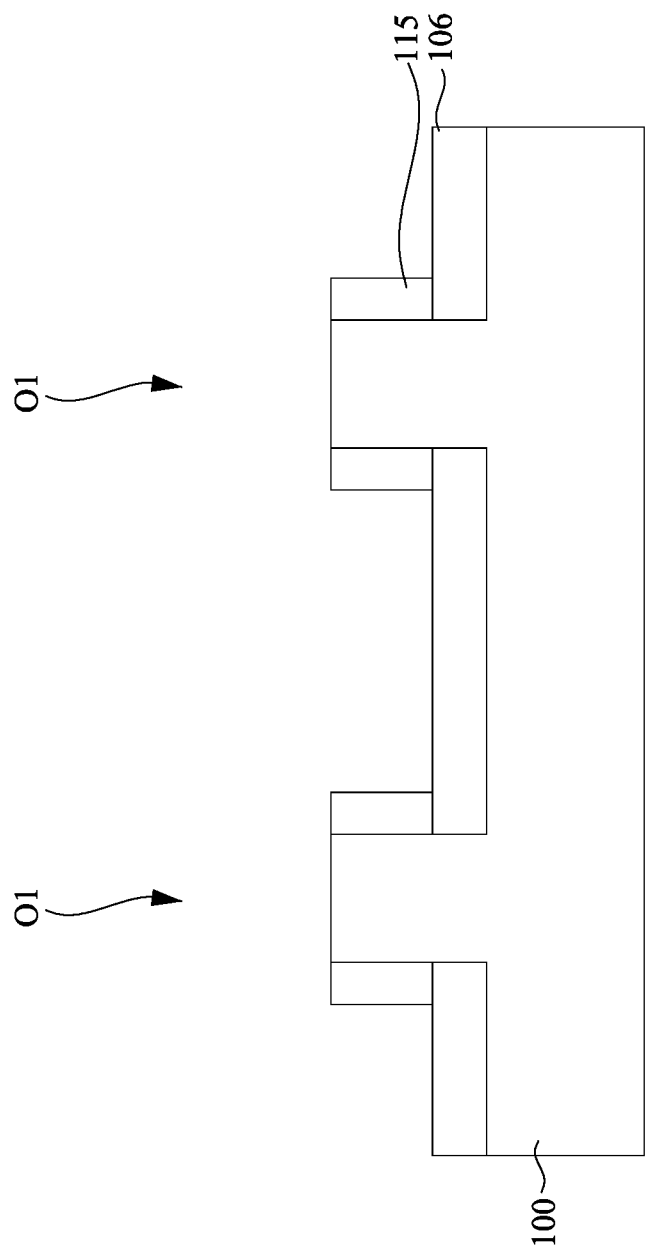

Reference is made to FIGS. 5A and 5B. An etching process is performed to remove portions of the fin structures FN (or the stacks ST) by using the dummy gate structures 130 and the spacers 115 as etch mask, so as to form source/drain openings O1 in the fin structures FN (or in the stacks ST). In some embodiments, the etching process may be wet etch, dry etch, or combinations thereof. In some embodiments, the bottommost ends of the source/drain openings O1 may be lower than the bottommost semiconductor layer 104.

Figure 6A:
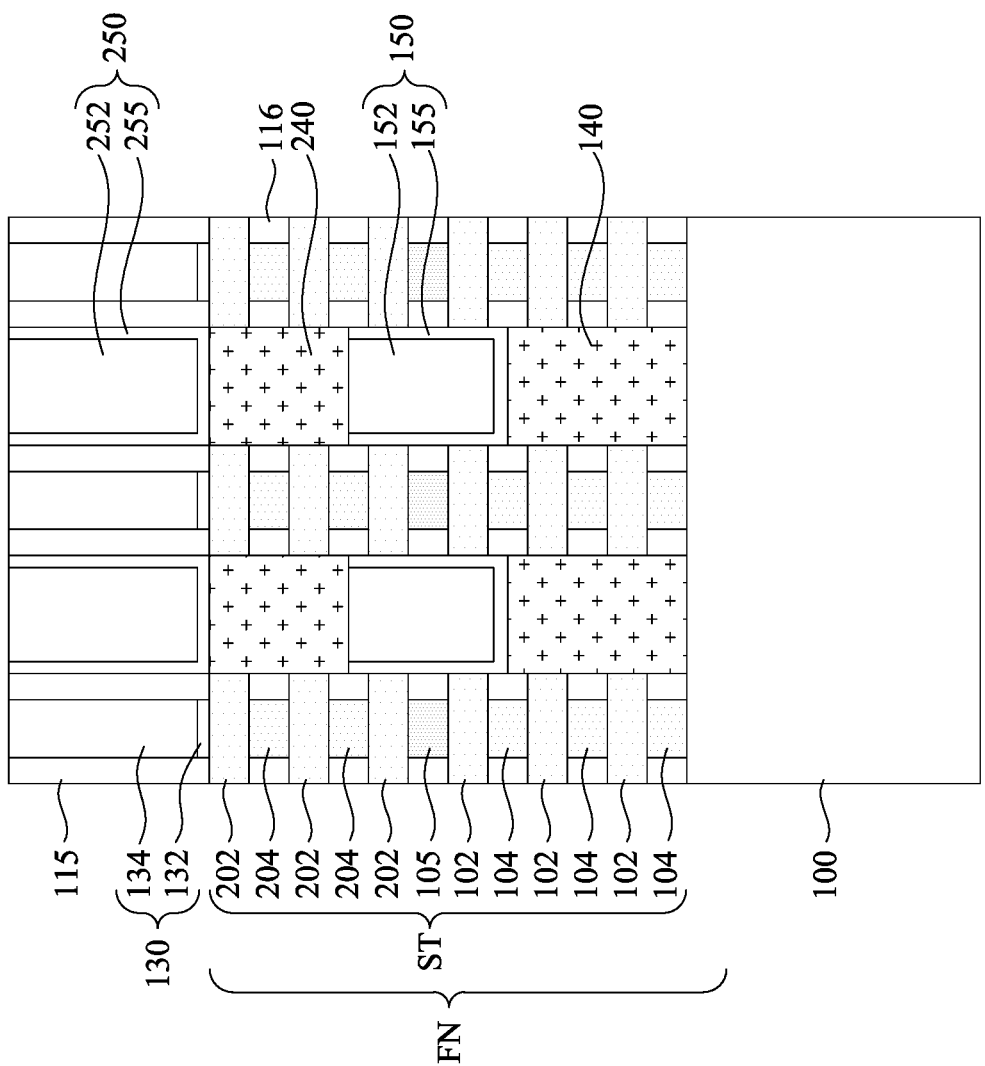
Figure 6B:
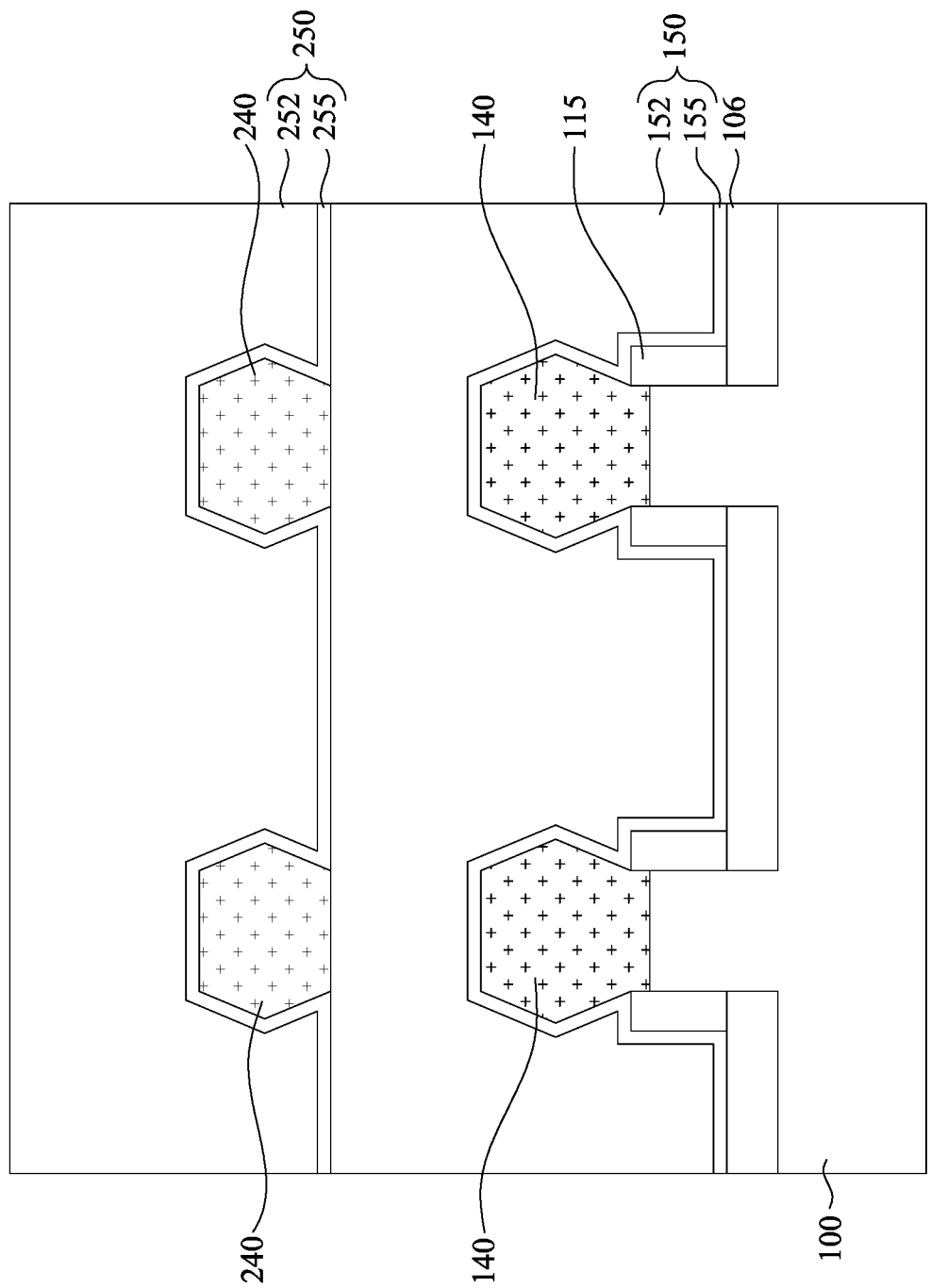

Reference is made to FIGS. 6A and 6B. After the source/drain openings O1 are formed, the semiconductor layers 104, 105, and 204 are laterally etched to form sidewall recesses. In some embodiments, the sidewalls of the semiconductor layers 104, 105, and 204 may be etched using isotropic etching processes, such as wet etching or the like. In some embodiments where the semiconductor layers 104, 105, and 204 include, e.g., SiGe, and the semiconductor layers 102 and 202 include, e.g., Si, an etch process with tetramethylammonium hydroxide (TMAH), ammonium hydroxide (NH$_4$OH), or the like may be used to etch sidewalls of the semiconductor layers 104, 105, and 204.

Inner spacers 116 are formed in the sidewall recesses on opposite ends of each of the semiconductor layers 104, 105, and 204. In some embodiments, the inner spacers 116 may be formed by, for example, depositing an inner spacer layer blanket over the substrate 100 and filling the sidewall recesses, and then performing an anisotropic etching to remove portions of the inner spacer layer outside the sidewall recesses, leaving the remaining portions of the inner spacer layer in the sidewall recesses as the inner spacers 116. The inner spacers 116 may be deposited by a conformal deposition process, such as CVD. ALD, or the like. The inner spacer layer may include a material such as SiN, SiOCN, SiCN, SIOC, although any suitable material, such as low-dielectric constant (low-k) materials having a k-value less than about 3.5, may be utilized.

First source/drain epitaxy structures 140 are formed in the openings O1, respectively. The first source/drain epitaxy structures 140 may be formed by suitable deposition process, such as a selective epitaxial growth (SEG) process. In some embodiments, the SEG process may selectively grow a semiconductor material on exposed semiconductor surfaces, such as the exposed surfaces of the substrate 100 and the exposed surfaces of the semiconductor layers 102. In some embodiments, an implantation process may be performed to the first source/drain epitaxy structures 140. For example, the implantation process may include p-type dopants, such as boron (B), gallium (Ga), indium (In), aluminium (Al), or the like, such that the first source/drain epitaxy structures 140 are p-type epitaxy structures.

A contact etch stop layer (CESL) 155 is formed covering the first source/drain epitaxy structures 140, and an interlayer dielectric (ILD) layer 152 is formed over the CESL 155. Then, an etching back process is performed to lower top surfaces of the CESL 155 and the ILD layer 152, such that sidewalls of the semiconductor layers 202 are exposed through the source/drain openings O1. In some embodiments, the CESL 155 and the ILD layer 152 can be collectively referred to as an isolation structure 150. In some embodiments, the topmost semiconductor layer 102 and the bottommost semiconductor layer 202 are in contact with the CESL 155 of the isolation structure 150.

In some embodiments, the CESL 155 may be nitride (such as silicon nitride), and the ILD layer 152 may be oxide (such as silicon oxide). In some embodiments, the CESL 155 may be a dielectric layer including silicon nitride, silicon oxynitride or other suitable materials. In some embodiments, the ILD layer 152 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The CESL 155 and the ILD layer 152 can be formed using, for example, CVD, ALD or other suitable techniques.

Second source/drain epitaxy structures 240 are formed on opposite ends of each of the semiconductor layers 202. In some embodiments, the second source/drain epitaxy structures 240 may be formed by a selective epitaxial growth (SEG) process. The SEG process may selectively grow a semiconductor material on exposed semiconductor surfaces, such as the exposed surfaces of the semiconductor layers 202. In some embodiments, an implantation process may be performed to the second source/drain epitaxy structures 240. For example, the implantation process may include n-type dopants, such as phosphorus (P), arsenic (As), or antimony (Sb), or the like, such that the second source/drain epitaxy structures 240 are n-type epitaxy structures.

A contact etch stop layer (CESL) 255 is formed covering the second source/drain epitaxy structures 240. Afterwards, an interlayer dielectric (ILD) layer 252 is formed over the CESL 255. Then, a planarization process, such as CMP, is performed to remove excess materials of the CESL 255 and the ILD layer 252 until the dummy gate structures 130 are exposed. In some embodiments, the patterned masks MA1 are removed during the planarization process. In some embodiments, the CESL 255 and the ILD layer 252 can be collectively referred to as an isolation structure 250. The materials of the CESL 255 and the ILD layer 252 may be similar to the materials of the CESL 155 and the ILD layer 152, respectively. For example, the CESL 255 may be nitride (such as silicon nitride), and the ILD layer 252 may be oxide (such as silicon oxide).

Figure 7A:
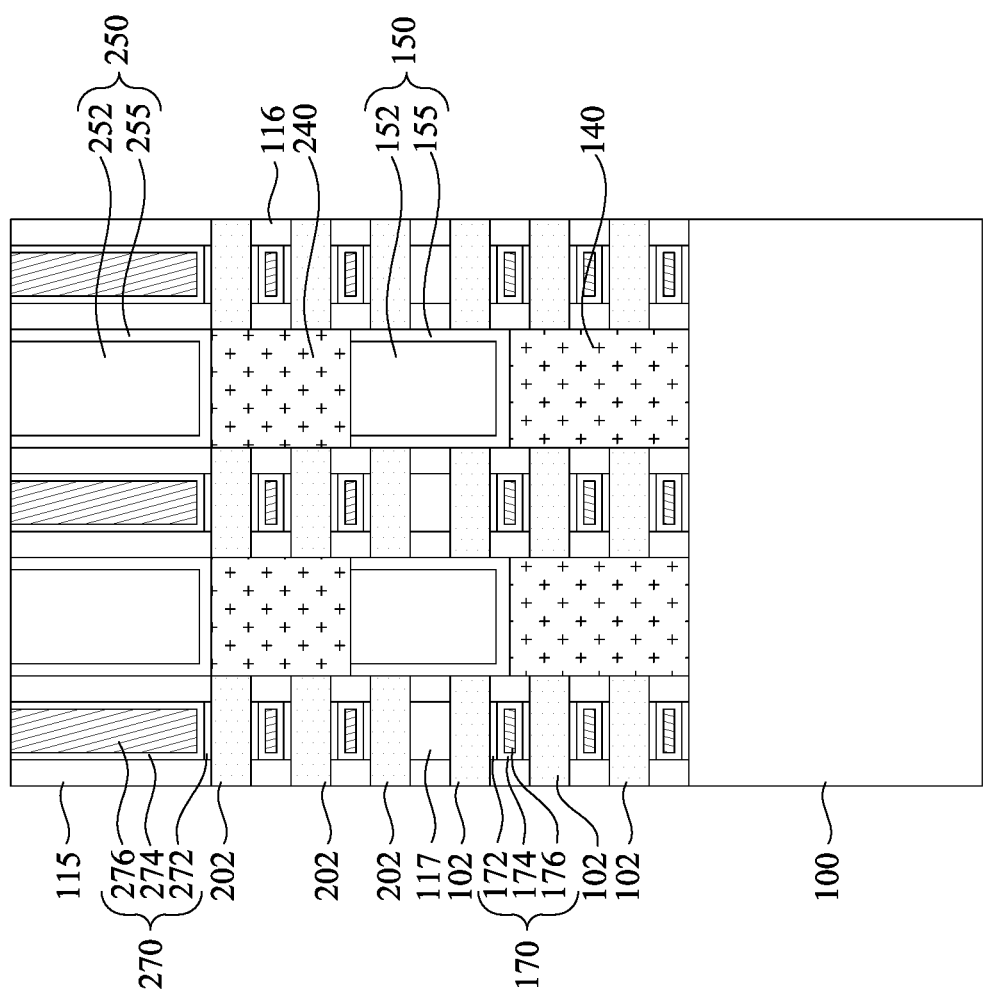
Figure 7B:
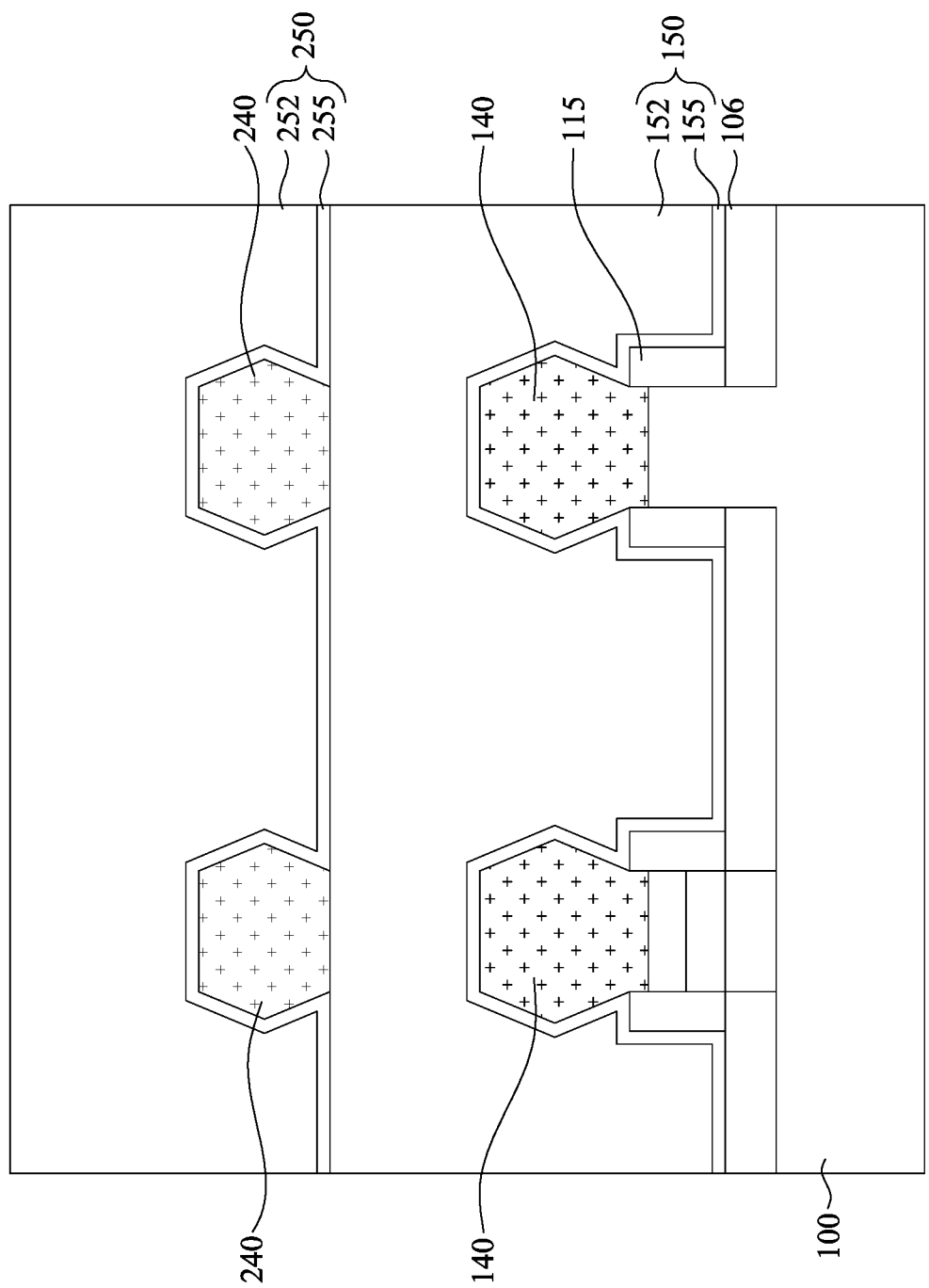
Figure 7C:
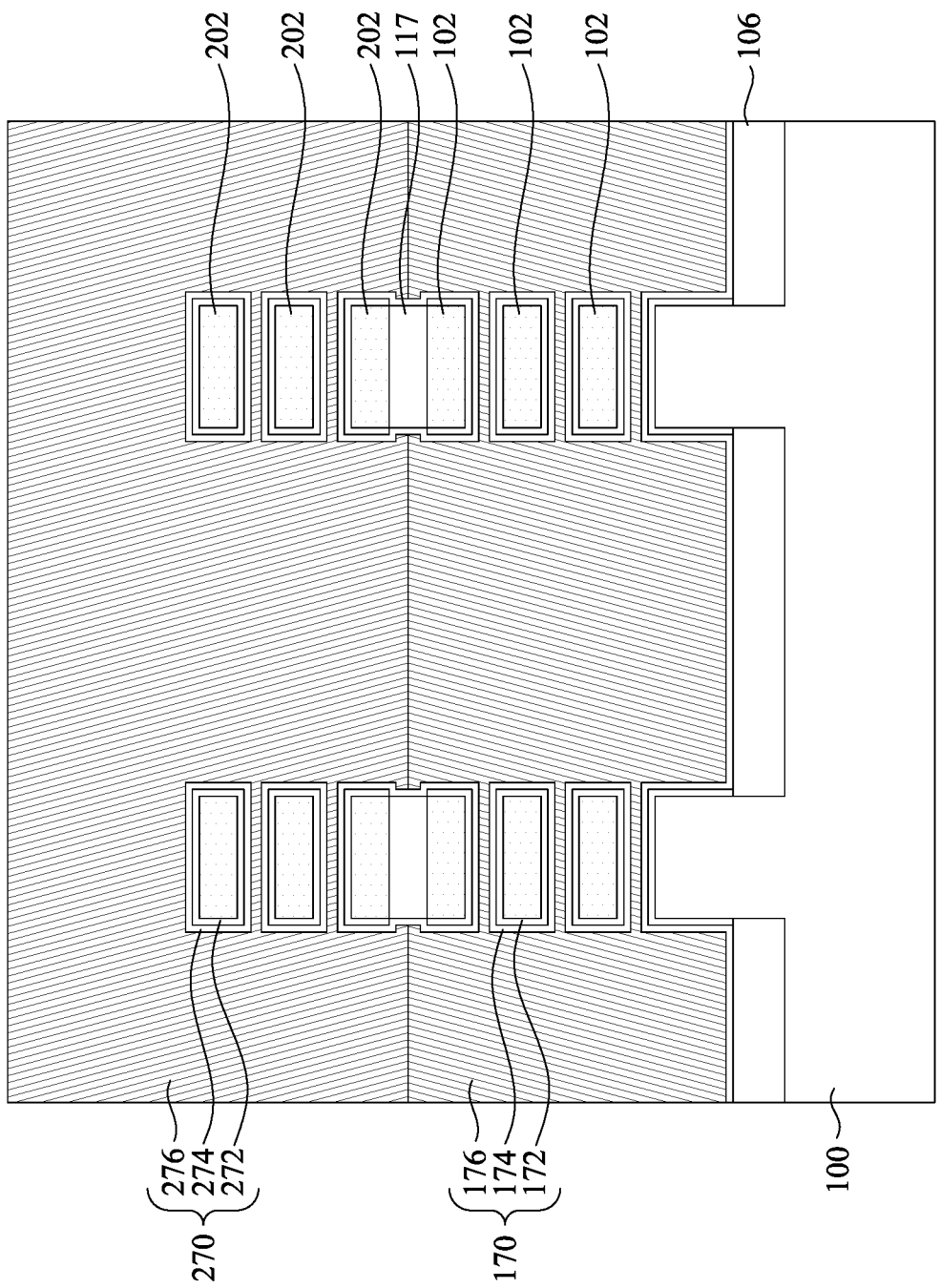

Reference is made to FIGS. 7A, 7B, and 7C. The dummy gate structures 130 are removed to form gate trenches between each pair of the gate spacers 115. Then, the semiconductor layers 105 are replaced with isolation layers 117. For example, an etching process is performed to remove the semiconductor layers 105 to form gaps vertically between the topmost semiconductor layer 102 and the bottommost semiconductor layer 202. As mentioned above, because the semiconductor layers 105 has a higher germanium concentration than the semiconductor layers 102, 104, 202, and 204, the etchant can be properly selected such that the semiconductor layers 105 are selectively removed, while keeping the semiconductor layers 102, 104, 202, and 204 substantially intact.

Afterwards, isolation material is formed in the gate trench and filling the gaps. An anisotropic etching process is performed to remove the isolation material outside the gaps, and the remaining portions of the isolation material in the gaps are referred to as the isolation layers 117. The material of the isolation layers 117 may be similar to the inner spacers 116, and thus relevant details will not be repeated for brevity.

After the isolation layers 117 are formed, an etching process is performed to remove the semiconductor layers 104 and 204 through the gate trenches, such that the semiconductor layers 102 and 202 are suspended over the substrate 100.

Interfacial layers 172 and 272 are formed on exposed surfaces of the semiconductor layers 102 and 202, respectively. Then, gate dielectric layers 174 and 274 are formed over the interfacial layers 172 and 272, respectively. In some embodiments, the interfacial layers 172 and 272 may be formed using a same deposition process, and the gate dielectric layers 174 and 274 may be formed using a same deposition process.

After the interfacial layers 172 and 272 and the gate dielectric layers 174 and 274 are formed, gate electrodes 176 are formed in the gate trenches and over the gate dielectric layers 174. The gate electrodes 176 are then etched back, such that the remaining gate electrodes 176 are at the lower portion of the gate trenches. Accordingly, first metal gate structures 170 are formed. In greater detail, the first metal gate structures 170 are formed in bottom portions of the gate trenches, such that the first metal gate structures 170 may wrap around the respective semiconductor layers 102. In some embodiments, each of the first metal gate structures 170 may include the interfacial layer 172, the gate dielectric layer 174 over the interfacial layer 172, and the gate electrode 176 over the gate dielectric layer 174.

In some embodiments, the interfacial layers 172 and 272 may be made of oxide, such as aluminum oxide ($Al_2O_3$), silicon oxide ($SiO_2$), or the like. In some embodiments, the gate dielectric layers 174 and 274 may include high-k dielectric. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrodes 176 may include work function metal layer(s) and a filling metal. The work function metal layer may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The filling metal may include tungsten (W), aluminum (Al), copper (Cu), or another suitable conductive material(s).

Gate electrodes 276 are formed in the gate trenches and over the first metal gate structures 170. Accordingly, second metal gate structures 270 are formed. In greater detail, the second metal gate structures 270 are formed in upper portions of the gate trenches and above the first metal gate structures 170, such that the second metal gate structures 270 may wrap around the respective semiconductor layers 202. In some embodiments, each of the second metal gate structures 270 may include the interfacial layer 272, the gate dielectric layer 274 over the interfacial layer 272, and the gate electrode 276 over the gate dielectric layer 274. The materials of the gate electrode 276 may be similar to those described with respect to the gate electrode 176, and thus relevant details will not be repeated for brevity.

The first metal gate structure 170, the first source/drain epitaxy structures 140 on opposite sides of the first metal gate structure 170, and the semiconductor layers 102 that are in contact with the first source/drain epitaxy structures 140 may collectively serve as the first transistor TR1 as described in FIG. 1. In such condition, the semiconductor layers 102 that are in contact with the first source/drain epitaxy structures 140 may also be referred to as channel layers of the first transistor TR1. Similarly, the second metal gate structure 270, the second source/drain epitaxy structures 240 on opposite sides of the second metal gate structure 270, and the semiconductor layers 202 that are in contact with the second source/drain epitaxy structures 240 may collectively serve as the second transistor TR2 as described in FIG. 1. In such condition, the semiconductor layers 202 that are in contact with the second source/drain epitaxy structures 240 may also be referred to as channel layers of the second transistor TR2. In FIG. 7A, opposite ends of the topmost semiconductor layer 102 are in contact with the isolation structures 150, and are not in contact with the first source/drain epitaxy structures 140. Thus, the topmost semiconductor layer 102 may not function as a channel layer of the first transistor TR1. Similarly, opposite ends of the bottommost semiconductor layer 202 are in contact with the isolation structure 150, and are not in contact with the second source/drain epitaxy structures 240. Thus, the topmost bottommost semiconductor layer 202 may not function as a channel layer of the second transistor TR2.

Figure 8A:
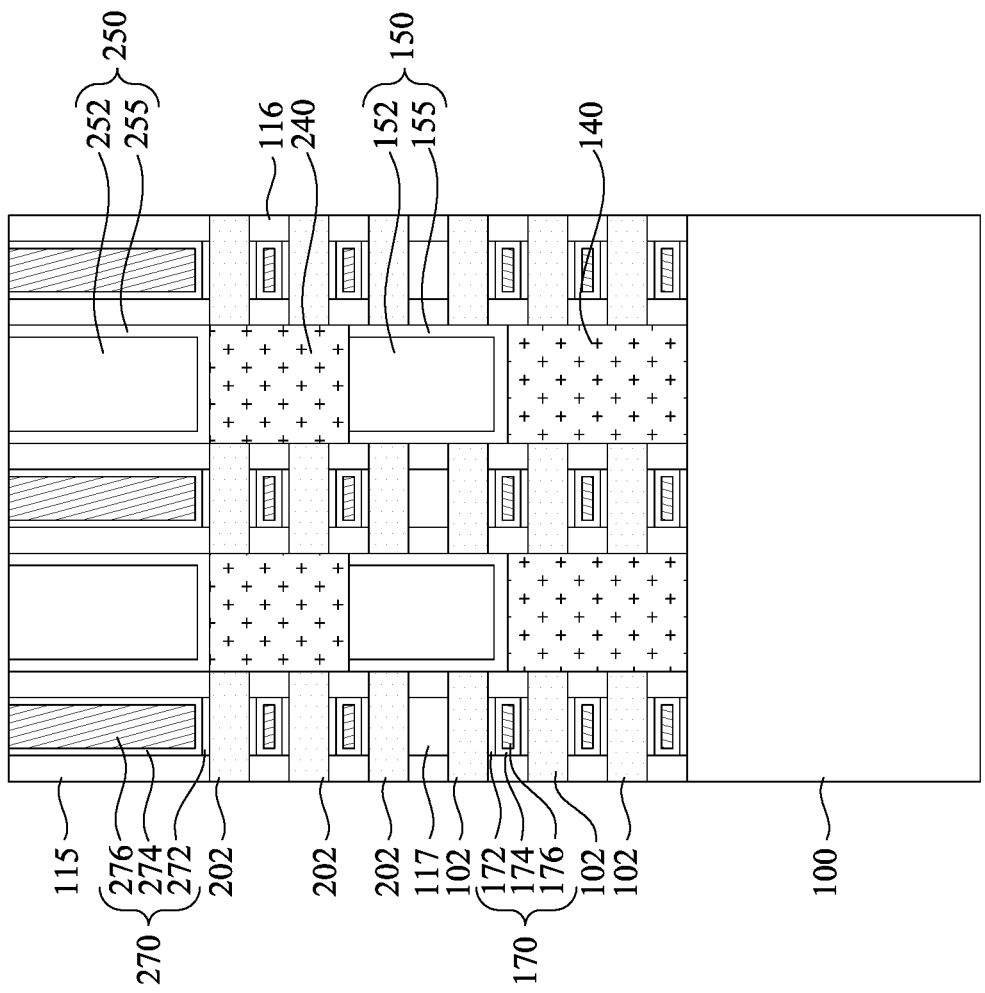
Figure 8B:
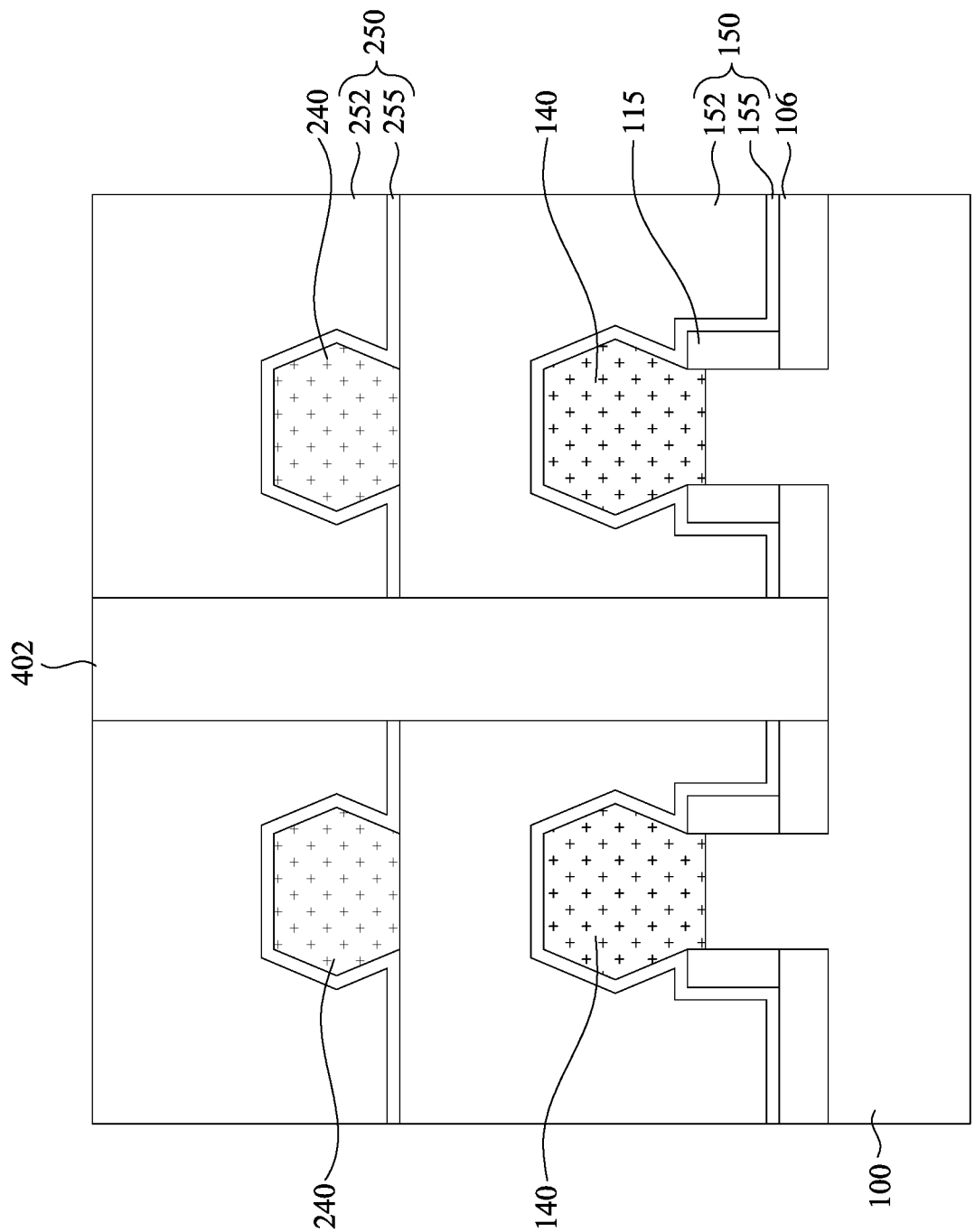
Figure 8C:
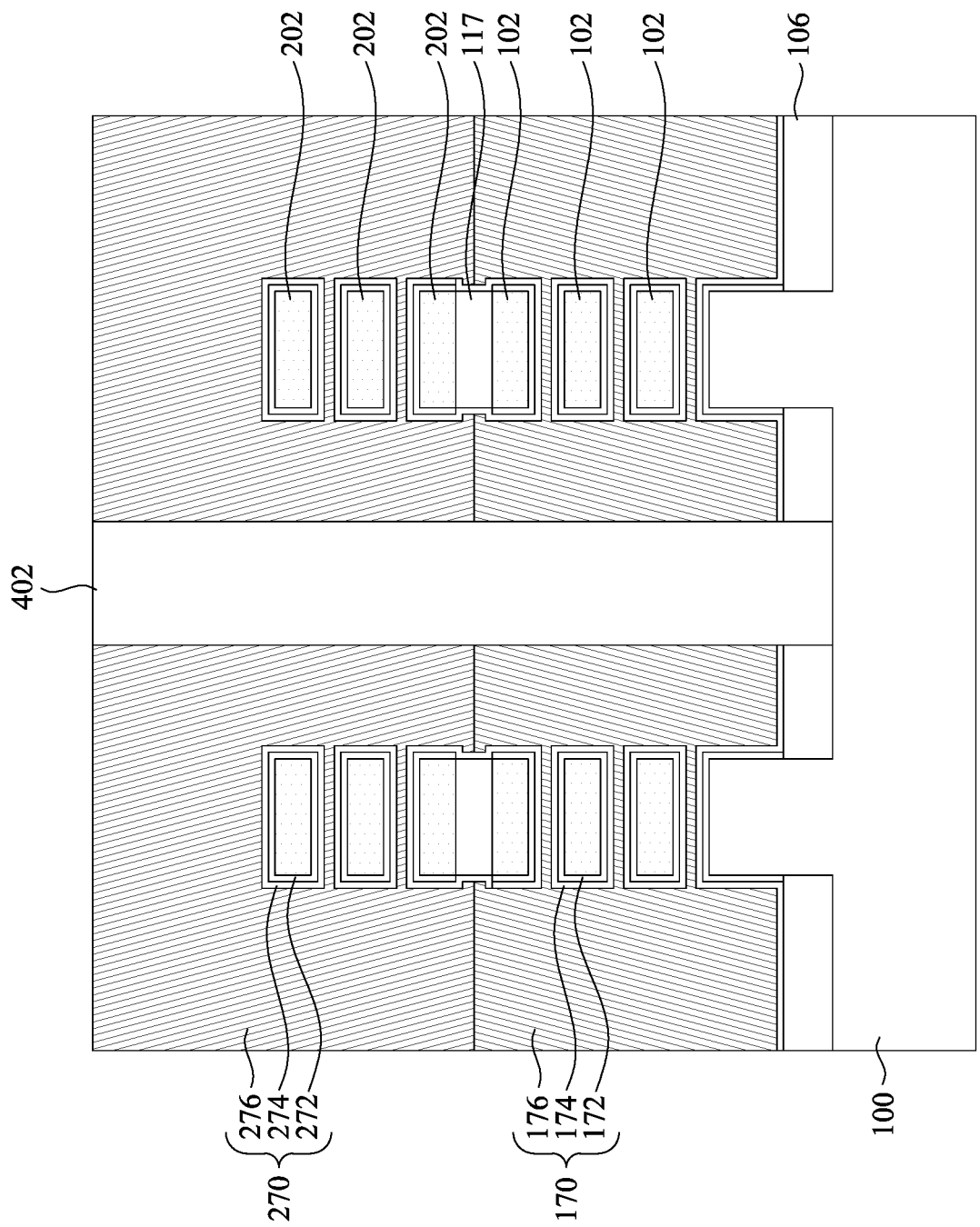

Reference is made to FIGS. 8A, 8B, and 8C. A dielectric structure 402 is formed. As shown in FIG. 8C, the dielectric structure 402 may cut through the first metal gate structure 170 and the second metal gate structure 270, so as to divide the first metal gate structure 170 and the second metal gate structure 270 into separated first metal gate structures 170 and separated second metal gate structures 270. As shown in FIG. 8B, the dielectric structure 402 may also cut through the isolation structures 150 and 250. In some embodiments, the dielectric structure 402 may extend through the isolation structures 106 and in contact with the substrate 100. In some embodiments, the dielectric structure 402 may also be referred to as a cut-metal-gate (CMG) isolation structure.

In some embodiments, the dielectric structure 402 may be made of nitride (e.g., silicon nitride), oxide (e.g., silicon oxide), combinations thereof, or other suitable dielectric material. The dielectric structure 402 may be formed by, for example, etching the first metal gate structure 170, the second metal gate structure 270, and the isolation structures 150 and 250 to form an opening, depositing a dielectric material in the opening, and then performing a planarization process (such as CMP) to remove excess materials of the dielectric material.

Figure 9A:
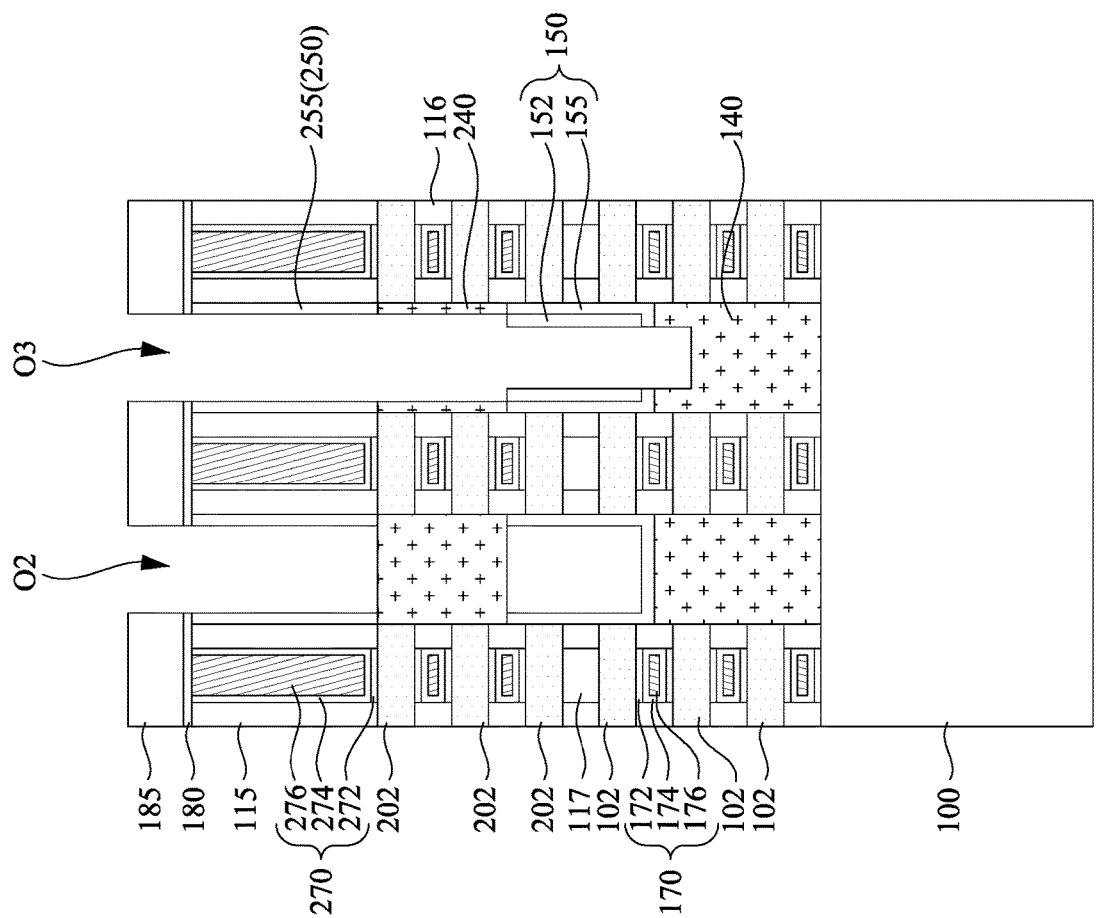
Figure 9B:
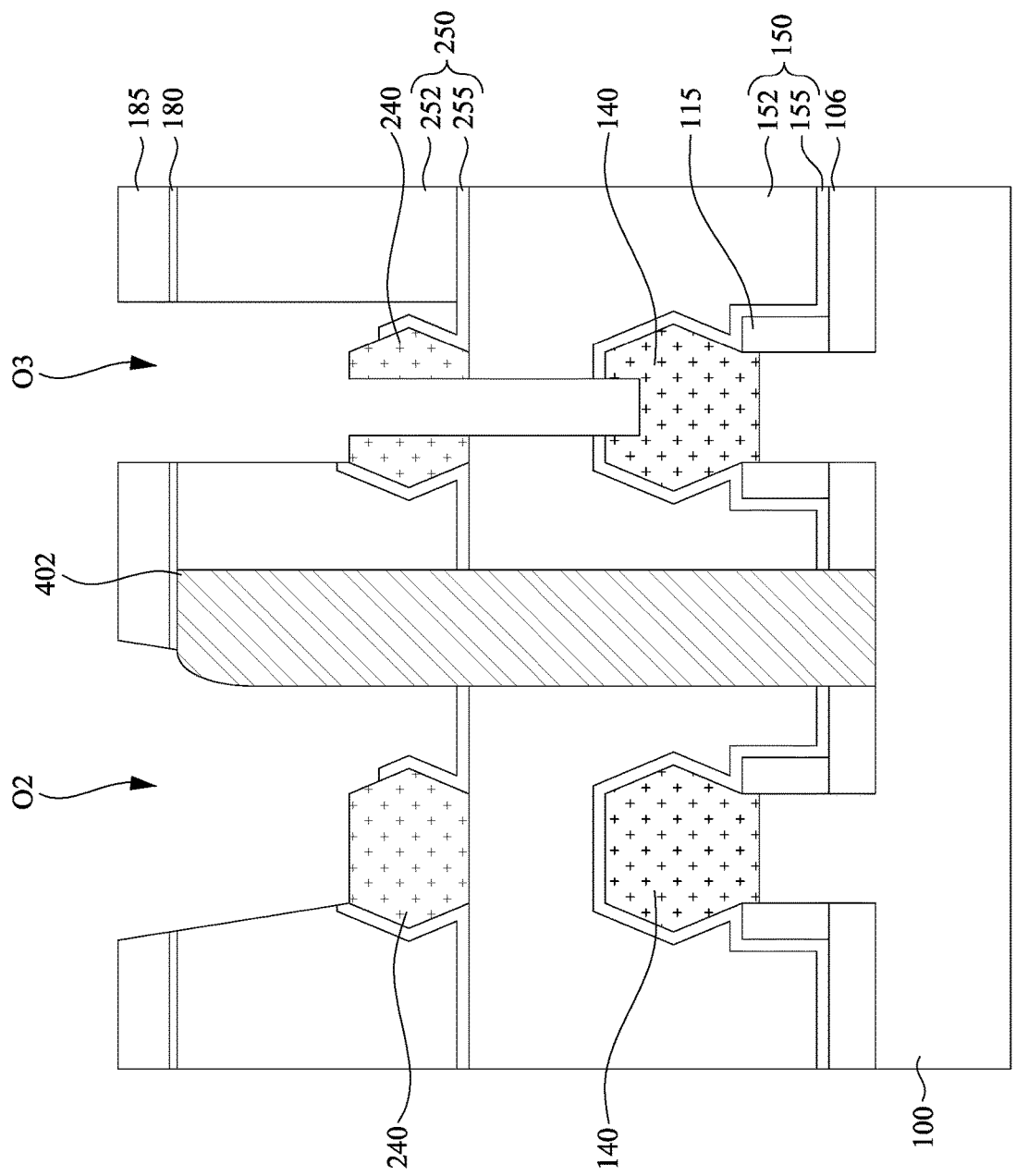

Reference is made to FIGS. 9A and 9B. An etch stop layer (ESL) 180 is formed over the isolation structures 250 and the second metal gate structures 270. Afterwards, an interlayer dielectric (ILD) layer 185 is formed over the ESL 180. The materials of the ESL 180 and the ILD layer 185 may be similar to the materials of the CESL 155 and the ILD layer 152, respectively. For example, the ESL 180 may be nitride (such as silicon nitride), and the ILD layer 185 may be oxide (such as silicon oxide). The ESL 180 and the ILD layer 185 can be formed using, for example, CVD, ALD or other suitable techniques.

An opening O2 is formed through the ILD layer 185, the ESL 180, and the isolation structure 250. On the other hand, an opening O3 is formed through the ILD layer 185, the ESL 180, the isolation structure 250, the second source/drain epitaxy structure 240, and the isolation structure 150. In some embodiments, the openings O2 and O3 may be formed through different photolithography process. For example, the opening O2 may be formed prior to or after the opening O3.

With respect to the opening O2, the opening O2 may be formed by performing an etching process, in which the etching process may stops until the top surface of the corresponding second source/drain epitaxy structure 240 is exposed. In the cross-sectional view of FIG. 9A, the ILD layer 252 (see FIG. 8A) is removed during the etching process, such that the CESL 255 is exposed through the opening O2. In the cross-sectional view of FIG. 9B, a portion of the dielectric structure 402 may also be removed during the etching process.

With respect to the opening O3, the opening O3 may be formed by performing an etching process, in which the etching process may stops until the top surface of the corresponding first source/drain epitaxy structure 140 is exposed. In the cross-sectional view of FIG. 9A, the opening O3 may penetrate through the corresponding second source/drain epitaxy structure 240 and expose the top surface of the corresponding first source/drain epitaxy structure 140. In some embodiments, the etching process may also slightly etch the corresponding first source/drain epitaxy structure 140, such that the bottom end of the opening O3 may extend into the corresponding first source/drain epitaxy structure 140. Moreover, portions of the ILD layer 152 may remain in the cross-sectional view of FIG. 9A.

Figure 10A:
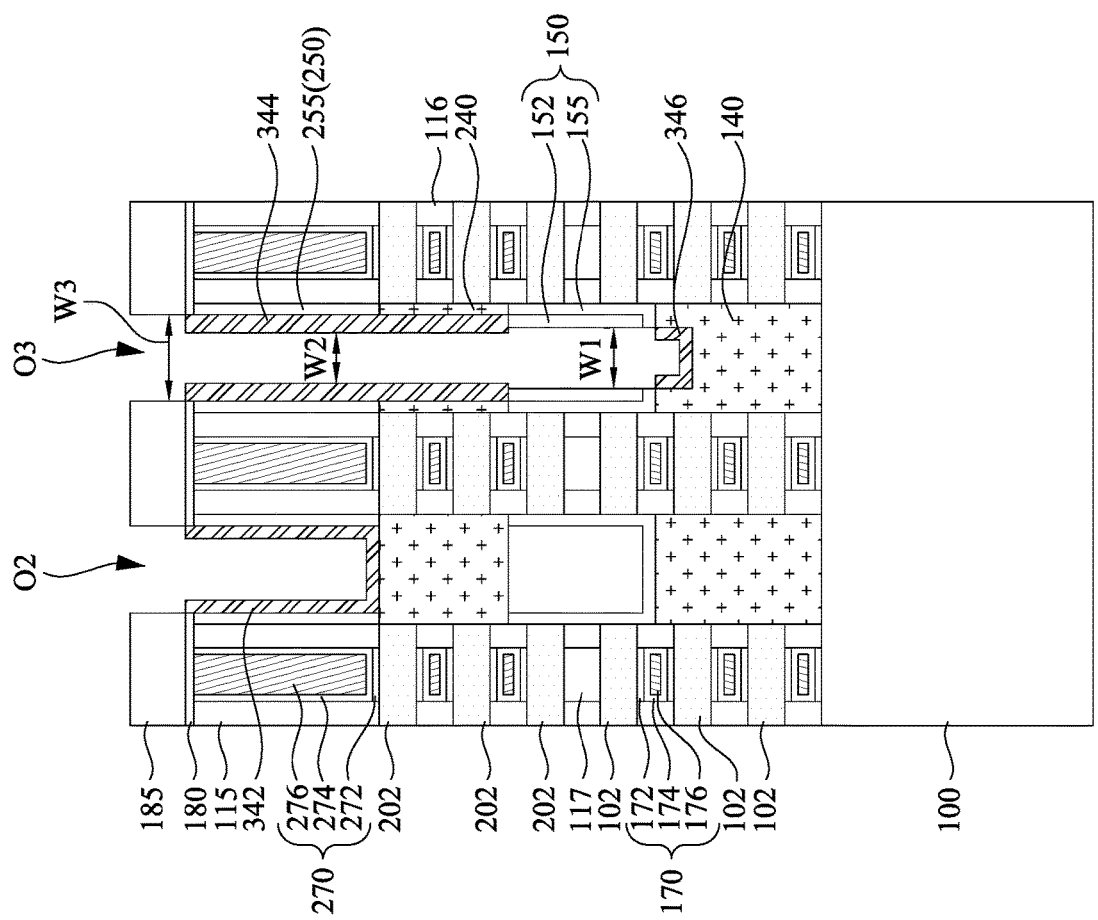
Figure 10B:
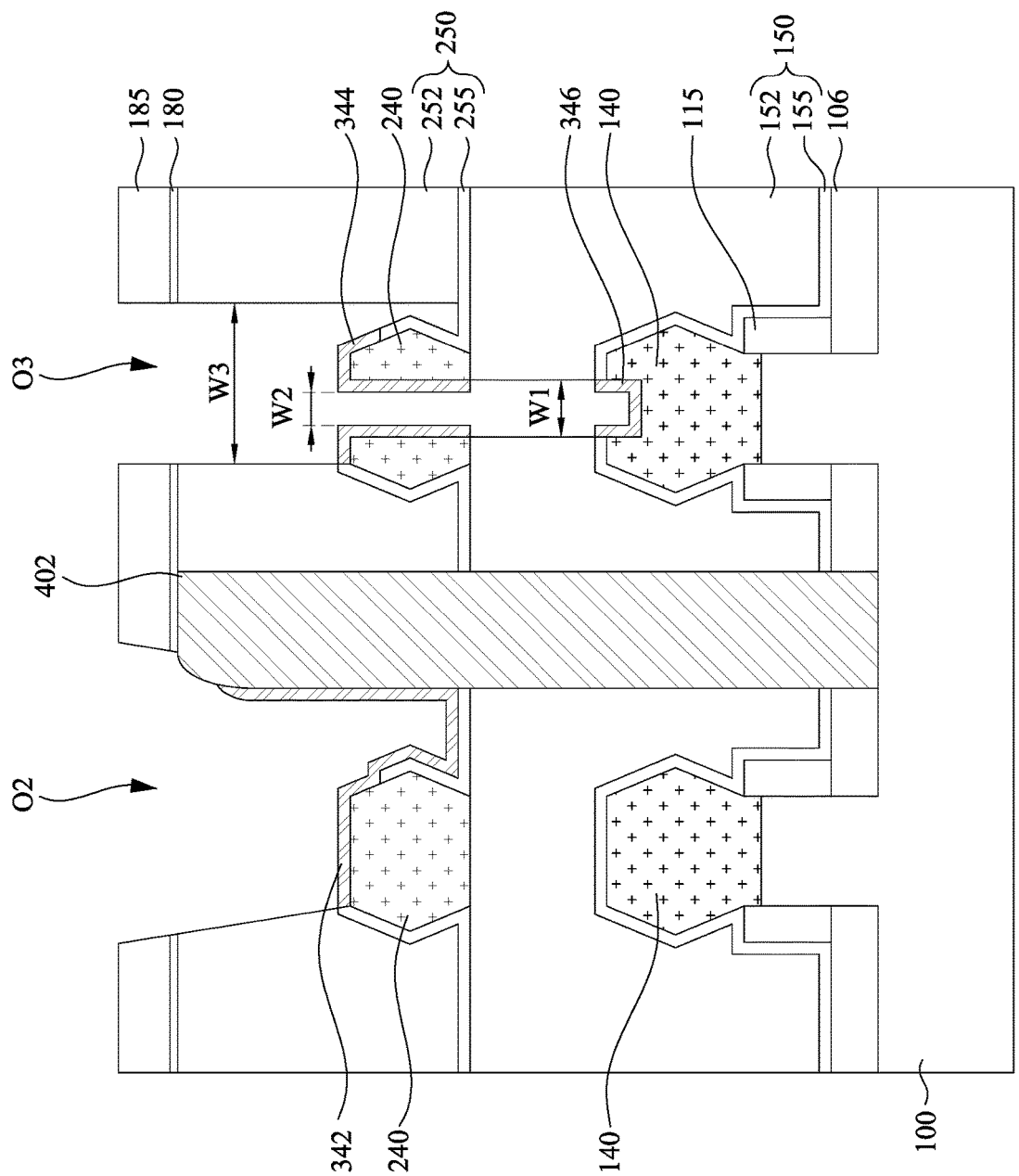

Reference is made to FIGS. 10A and 10B. Silicide layers 342, 344, and 346 are formed. In greater detail, the silicide layer 342 is formed in the opening O2 and lining the CESL 255 of the isolation structure 250 and the corresponding second source/drain epitaxy structure 240. On the other hand, the silicide layers 344 and 346 are formed in the opening O3, in which the silicide layer 344 lines the CESL 255 of the isolation structure 250 and the corresponding second source/drain epitaxy structure 240, and the silicide layer 346 lines the corresponding first source/drain epitaxy structure 140. In some embodiments, the silicide layers 342, 344, and 346 may be made of cobalt silicide ($CoSi_2$), titanium silicide ($TiSi_2$), tungsten silicide ($WSi_2$), nickel silicide ($NiSi_2$), molybdenum ($MoSi_2$), tantalum silicide ($TaSi_2$), platinum silicide (PtSi), or the like.

In some embodiments, the silicide layers 342, 344, and 346 are deposited using chemical vapor deposition (CVD) process. The CVD process may include deposition selectivity on different material surfaces. For example, in some embodiments, the material of the silicide layers 342, 344, and 346 may include higher deposition rates on the surfaces of the first source/drain epitaxy structure 140 (e.g., semiconductor material), the second source/drain epitaxy structure 240 (e.g., semiconductor material), and the CESLs 155 and 255 (e.g., nitride) than on the surfaces of the ILD layers 185, 252, and 152 (e.g., oxide). Stated another way, the material of the silicide layers 342, 344, and 346 may include lower deposition rates on the surfaces of the ILD layers 185, 252, and 152, such that no thickness or negligible thickness of silicide layer will be formed on the surfaces of the ILD layers 185, 252, and 152. Accordingly, after the silicide layers 342, 344, and 346 are formed, majority of the surfaces of the ILD layers 185, 252, and 152 are exposed through the silicide layers 342, 344, and 346.

With respect to the opening O3, due to the deposition selectivity as discussed above, a thicker silicide layer 344 is formed along the surfaces of the CESL 255 of the isolation structure 250 and the second source/drain epitaxy structure 240, while no silicide layer is formed on the surfaces of the ILD layer 152 of the isolation structure 150 and the ILD layer 185. This will result in that, after the silicide layers 342, 344, and 346 are formed, the opening O3 includes a first portion within the isolation structure 150, a second portion within the second source/drain epitaxy structure 240 and/or the isolation structure 250, and a third portion within the ILD layer 185. The first portion of the opening O3 has a width W1, the second portion of the opening O3 has a width W2, and the third portion of the opening O3 has a width W3, in which the width W2 is narrower than the widths W1 and W3.

Figure 11A:
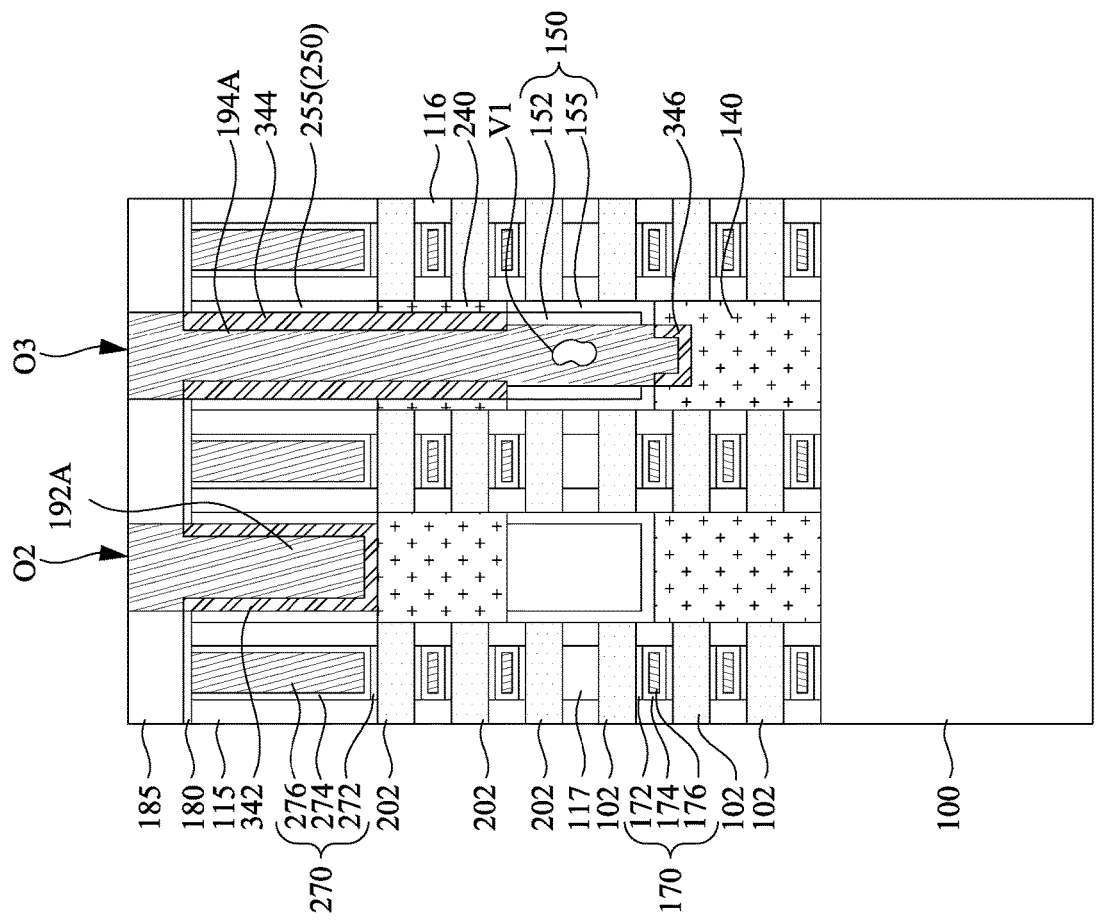
Figure 11B:
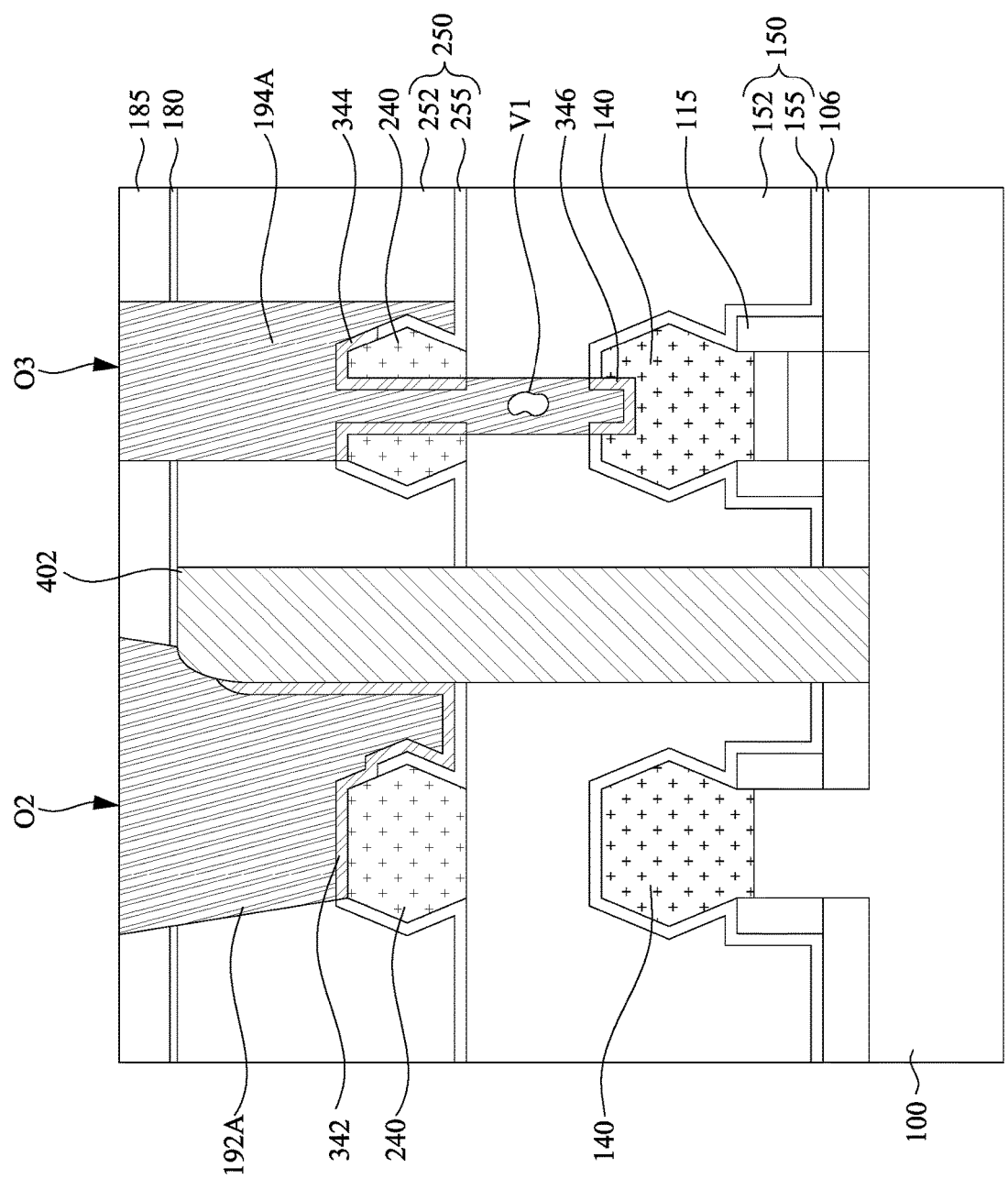

Reference is made to FIGS. 11A and 11B. First metals 192A and 194A are formed in the openings O2 and O3, respectively. In some embodiments, the first metals 192A and 194A may be formed using suitable deposition process, such as CVD, atomic layer deposition (ALD), or the like. With respect to the opening O2, because the opening O2 has a lower aspect ratio than the opening O3, the metal may be easily filled in the opening O2. However, with respect to the opening O3, the opening O3 include a higher aspect ratio, which will make the metal gap fill process even harder. Moreover, the opening O3 has a narrower portion within the second source/drain epitaxy structure 240 and the CESL 255, which will make the metal early merge at the narrow side during the metal gap fill process. Accordingly, a void V1 may be formed in the portion of the first metal 194A that is within the ILD layer 152 of isolation structure 150. In some embodiments, the position of the void V1 may be lower than the bottom surface of the second source/drain epitaxy structure 240 and higher than the top surface of the first source/drain epitaxy structure 140. In some embodiments, the first metals 192A and 194A may include tungsten (W), copper (Cu), aluminum (Al), ruthenium (Ru), cobalt (Co), molybdenum (Mo), nickel (Ni), or other suitable conductive material. In one embodiment, the first metals 192A and 194A may include ruthenium (Ru) deposited using CVD, and the grain size of the Ru is in a range from about 20 nm to about 40 nm.

Figure 12A:
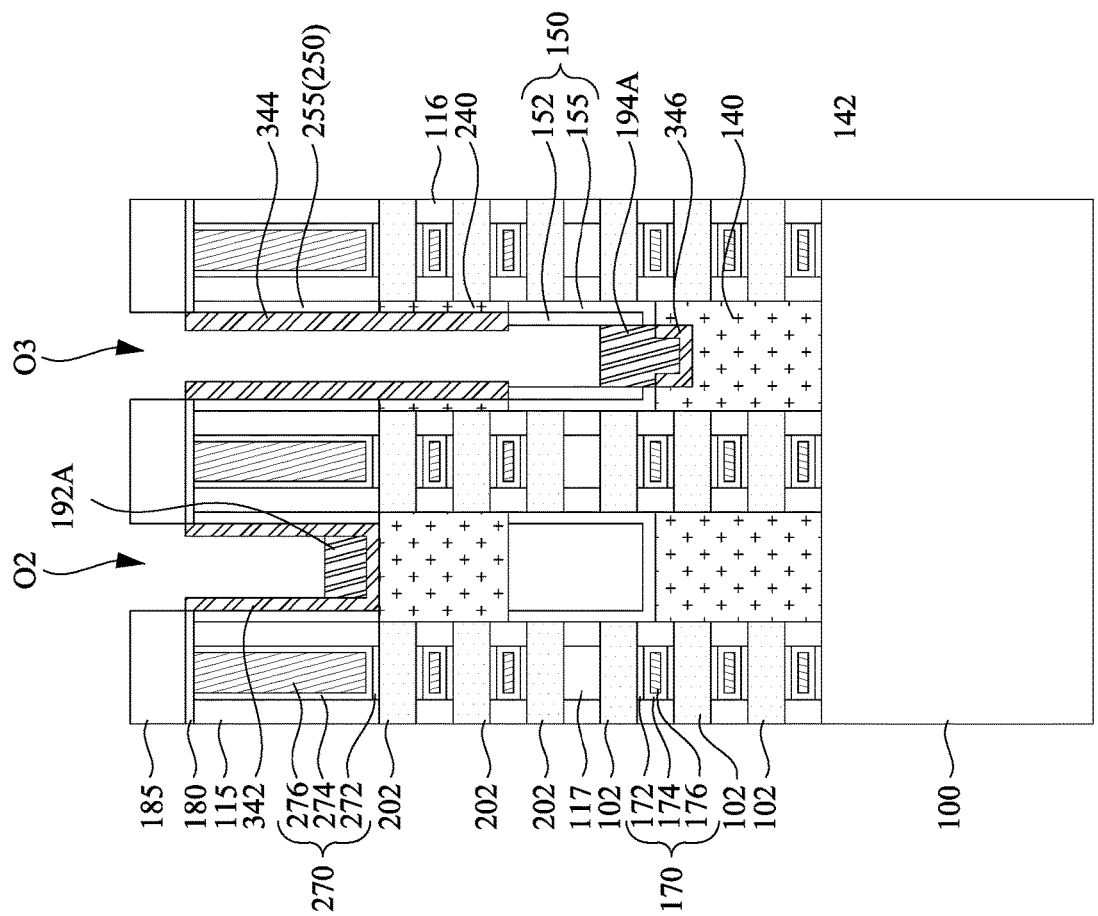
Figure 12B:
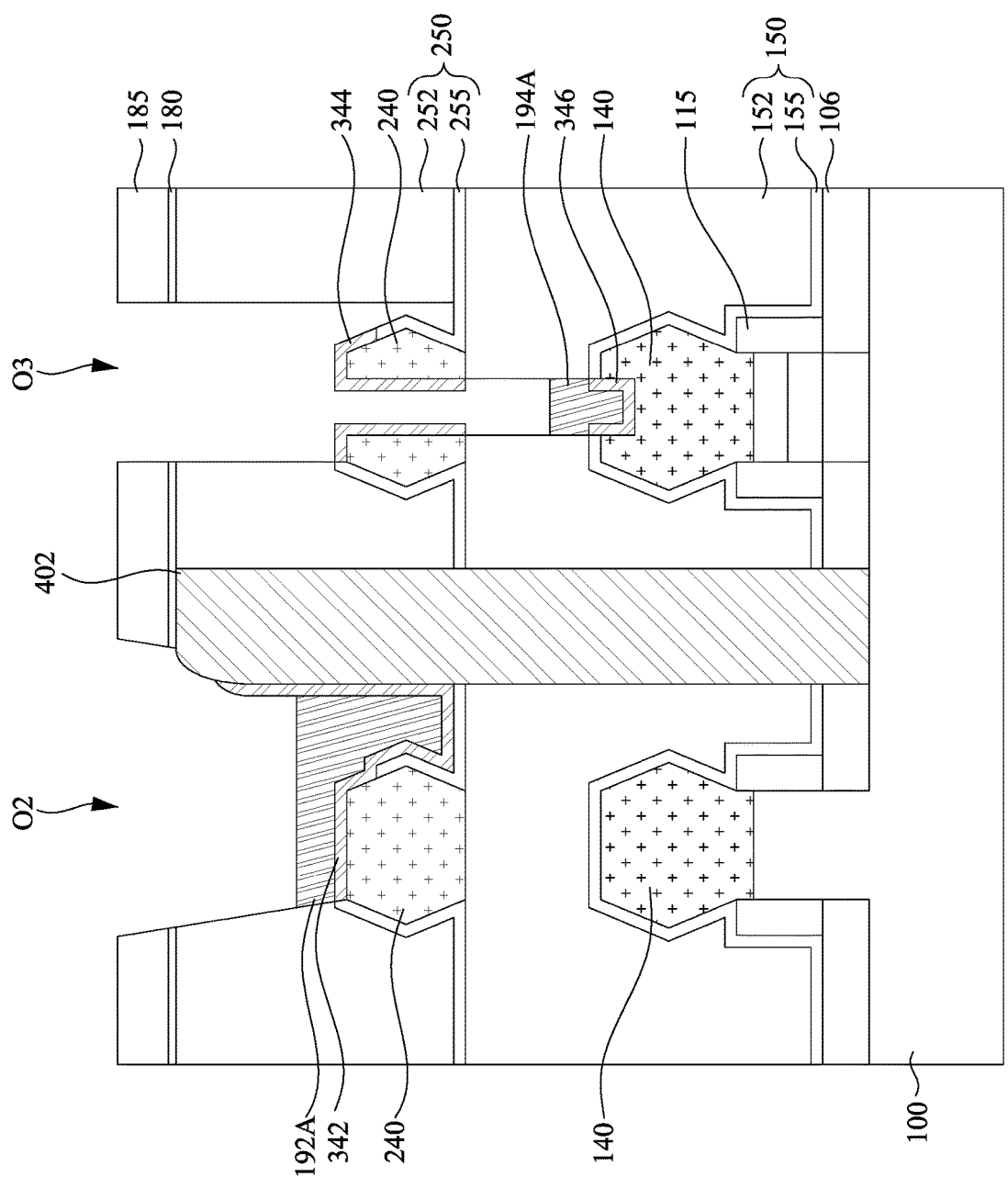

Reference is made to FIGS. 12A and 12B. An etching back process is performed to the first metals 192A and 194A, so as to lower the first metals 192A and 194A to a desired position. In greater detail, the goal of the etching back process is to remove portion of the first metal 194A until the void V1 is absent. In some embodiments, the etching back process may stop once the top surface of the etched first metal 194A is lower than the void V1 of the first metal 194A as shown in FIGS. 11A and 11B.

In some embodiments, the etching back process may include suitable etching process such as dry etch or wet etch. The dry etch may be performed using etchants including $Cl_2/O_2$, $O_2/H_2$, or O3. The wet etch may be performed using etchants including $H_5IO_6$. In some embodiments, the etchants may include oxygen ($O_2$), hydrogen ($H_2$), chlorine ($Cl_2$), iodine (I). In some embodiments, materials of the etchants may be present at the etched surfaces of the first metals 192A and 194A. For example, oxygen element (O), hydrogen element (H), halogen element (e.g., $Cl_2$ or I) may be detected at the etched surfaces of the first metals 192A and 194A.

Figure 13A:
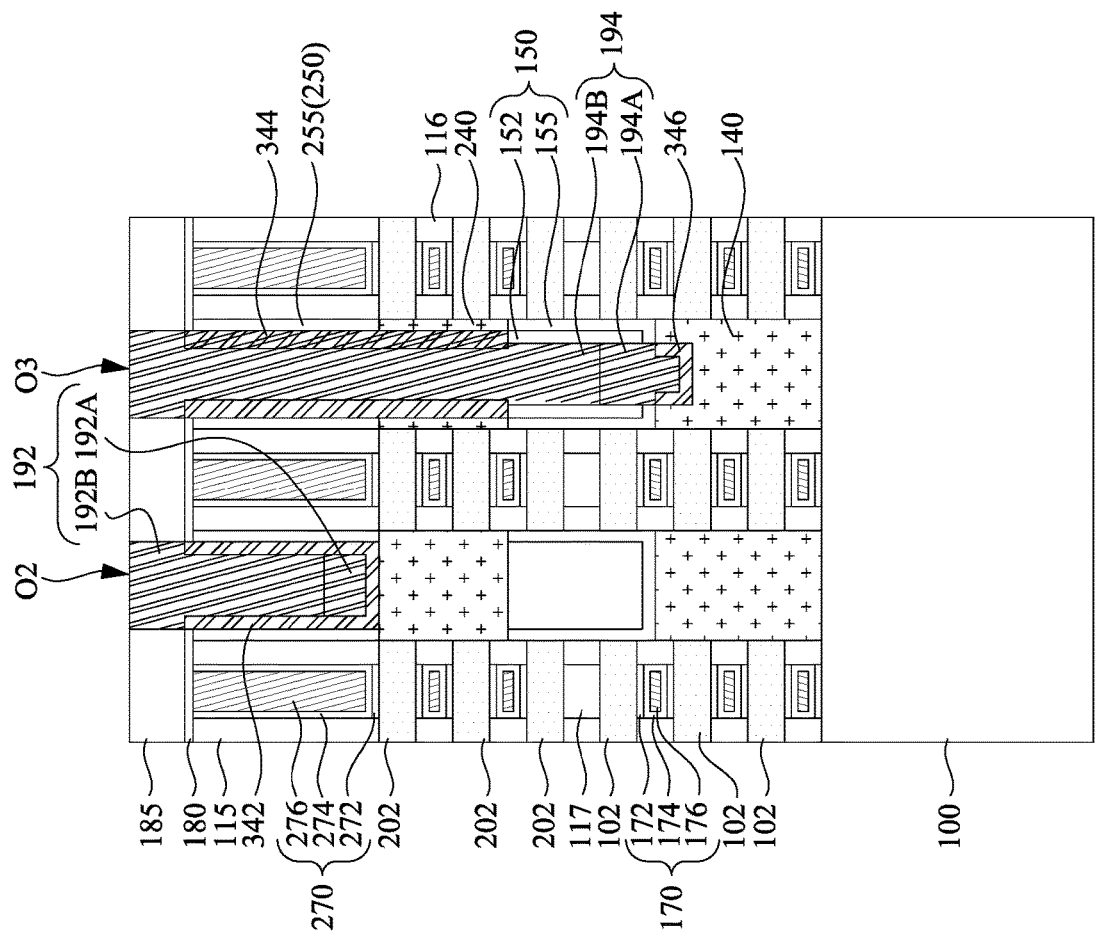
Figure 13B:
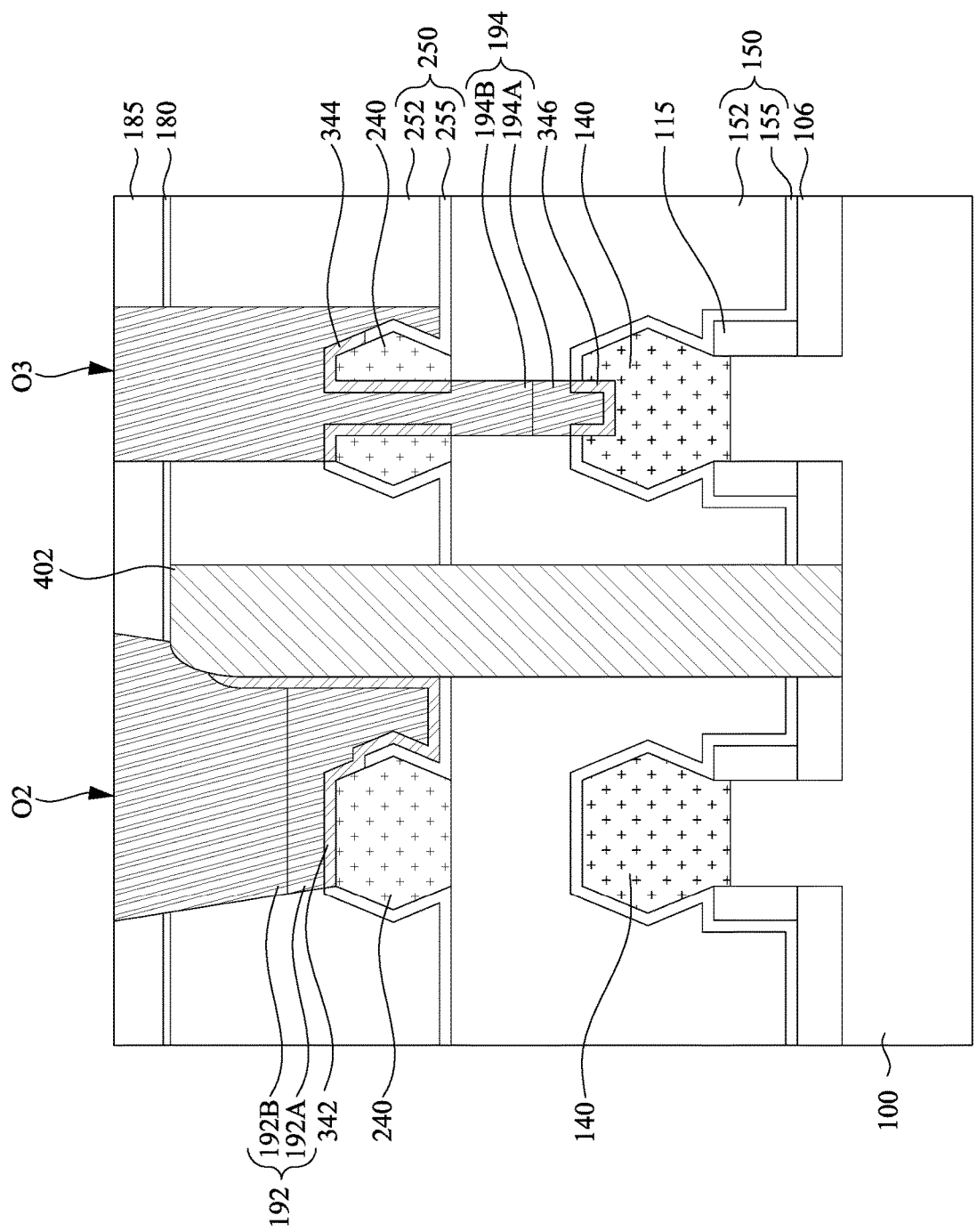

Reference is made to FIGS. 13A and 13B. Second metals 192B and 194B are formed in the openings O2 and O3, and are formed over the first metals 192A and 194A, respectively. Materials and formation method of the second metals 192B and 194B may be similar to those described with respect to the first metals 192A and 194A, and thus relevant details will not be repeated for brevity. The first metal 192A and the second metal 192B can be collectively referred to a source/drain contact 192, and the first metal 194A and the second metal 194B can be collectively referred to a source/drain contact 194, respectively. Stated another way, the first metal 192A and the second metal 192B can be referred to as the first portion and the second portion of the source/drain contact 192. The first metal 194A and the second metal 194B can be referred to as the first portion and the second portion of the source/drain contact 194.

In some embodiments, because the bottom portion of the opening O3 has been filled with the first metal 194A, the aspect ratio of the opening O3 is therefore reduced. Accordingly, due to the lowered aspect ratio of the opening O3, the second metal 194B may be filled in the opening O3 without void formation. Based on the processes discussed in FIGS. 11A to 13B, embodiments of the present disclosure provide a deposition-etch-deposition process to form the source/drain contacts 192 and 194. The deposition-etch-deposition process allows the source/drain contacts 192 and 194 being formed, layer-by-layer, in a high aspect ratio opening (e.g., opening O3) through a bottom-up manner, which will improve the gap fill capability and may achieve a void-free gap filling process.

As mentioned above, during the etching back process of FIGS. 12A and 12B, materials of the etchants may be present at the etched surfaces of the first metals 192A and 194A. As a result, the materials of the etchants may be present at the interface between the first metal 192A and the second metal 192B, and at the interface between the first metal 194A and the second metal 194B. For example, oxygen ($O_2$), hydrogen ($H_2$), halogen element (e.g., $Cl_2$ or I) may be detected at the interface between the first metal 192A and the second metal 192B, and at the interface between the first metal 194A and the second metal 194B.

Figure 14:
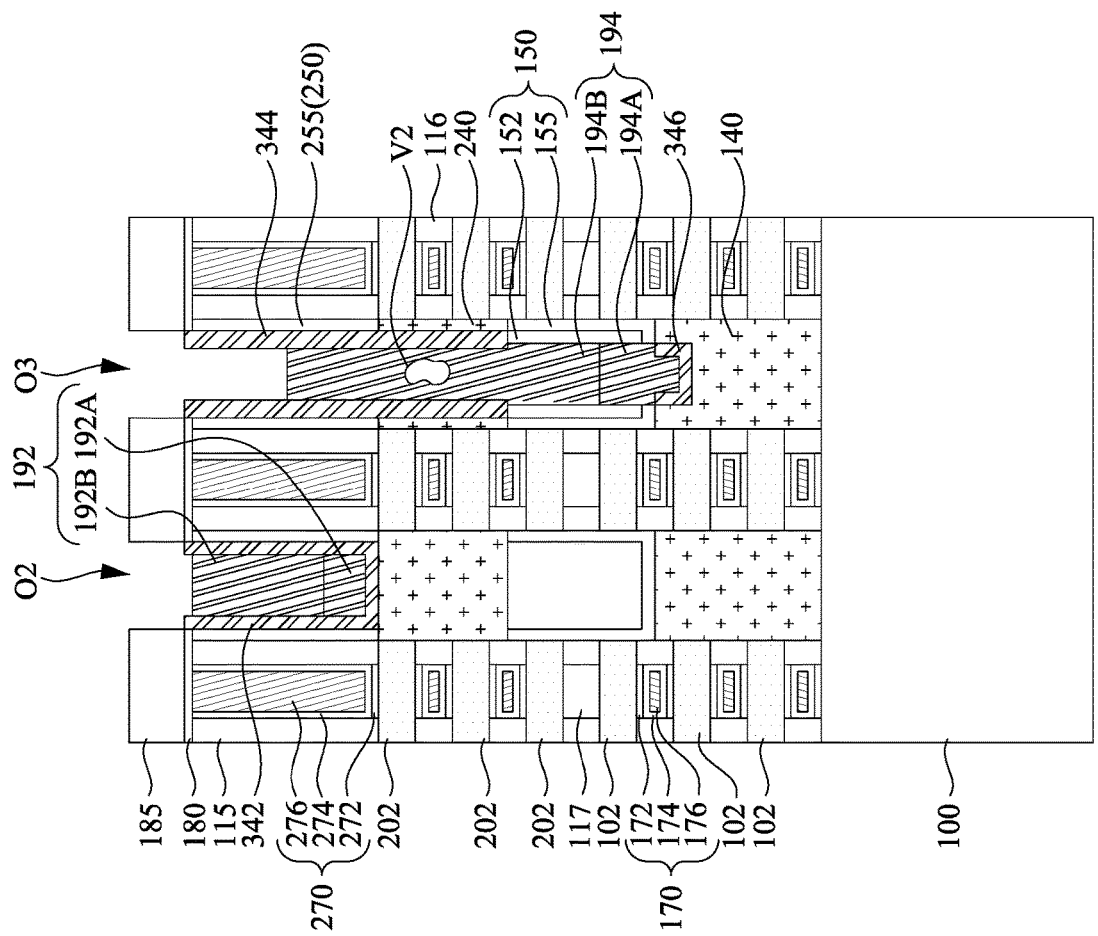
FIGS. 14 to 16 illustrate a method in various stages of forming a semiconductor device in accordance with some embodiments of the present disclosure.
Figure 15:
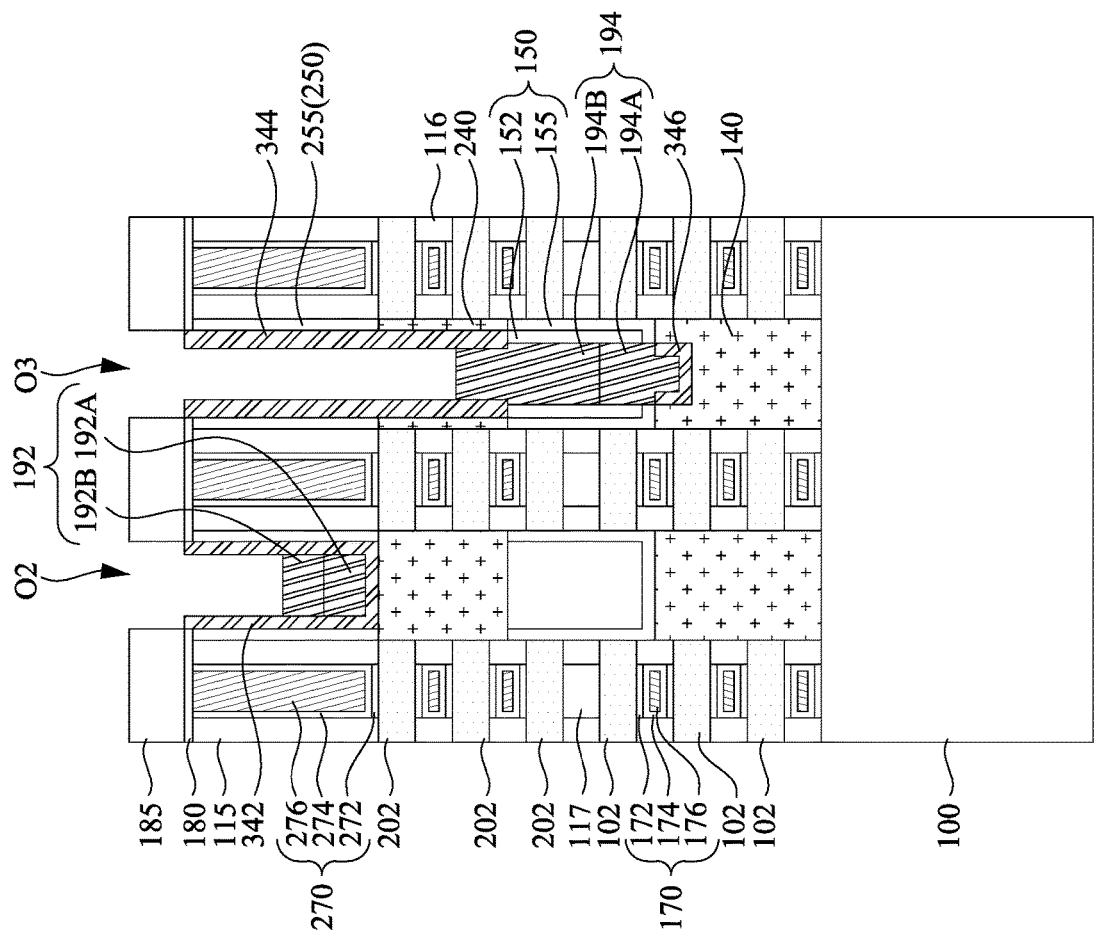
Figure 16:
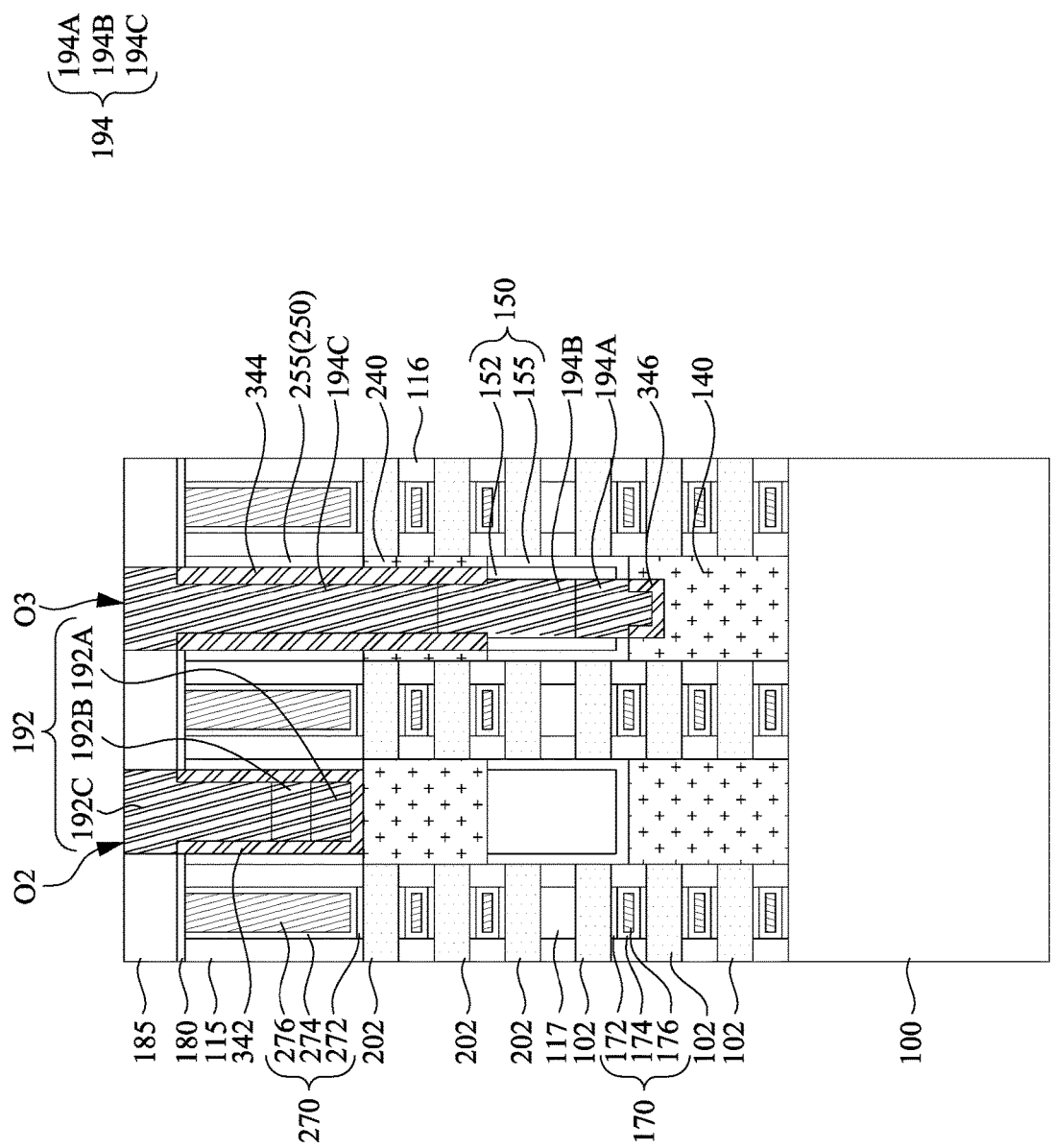

FIGS. 14 to 16 illustrate a method in various stages of forming a semiconductor device in accordance with some embodiments of the present disclosure. It is noted that some elements discussed in FIGS. 14 to 16 are similar to those described with respect to FIGS. 1 and FIGS. 2A to 13B, such elements are labeled the same, and relevant details will not be repeated for brevity.

Reference is made to FIG. 14. FIG. 14 is similar to FIG. 13A, the difference between FIG. 14 and FIG. 13A is that in the embodiments of FIG. 14, a void V2 may still be formed in the second metal 194B because of the high aspect ratio of the opening O3. In some embodiments, the position of the void V2 may be lower than the top surface of the second source/drain epitaxy structure 240 and higher than the bottom surface of the second source/drain epitaxy structure 240.

Reference is made to FIG. 15. An etching back process is performed to the second metals 192B and 194B, so as to lower the second metals 192B and 194B to a desired position. In greater detail, the goal of the etching back process is to remove portion of the second metal 194B until the void V2 is absent. In some embodiments, the etching back process may stop once the top surface of the etched second metal 194B is lower than the void V2 of the second metal 194B as shown in FIG. 14.

In some embodiments, the etching back process may include suitable etching process such as dry etch or wet etch. The dry etch may be performed using etchants including $Cl_2/O_2$, $O_2/H_2$, or O3. The wet etch may be performed using etchants including $H_5IO_6$. In some embodiments, the etchants may include oxygen ($O_2$), hydrogen ($H_2$), chlorine ($Cl_2$), iodine (I). In some embodiments, materials of the etchants may be present at the etched surfaces of the second metals 192B and 194B. For example, oxygen ($O_2$), hydrogen ($H_2$), halogen element (e.g., $Cl_2$ or I) may be detected at the etched surfaces of the second metals 192B and 194B.

Reference is made to FIG. 16. Third metals 192C and 194C are formed in the openings O2 and O3, and are formed over the second metals 192B and 194B, respectively. Materials and formation method of the third metals 192C and 194C may be similar to those described with respect to the first metals 192A and 194A, and thus relevant details will not be repeated for brevity. The first metal 192A, the second metal 192B, and the third metal 192C can be collectively referred to a source/drain contact 192, and the first metal 194A, the second metal 194B, and the third metal 194C can be collectively referred to a source/drain contact 194, respectively. Stated another way, the first metal 192A, the second metal 192B, and the third metal 192C can be referred to as the first portion, the second portion, and the third portion of the source/drain contact 192. The first metal 194A, the second metal 194B, and the third metal 194C can be referred to as the first portion, the second portion, and the third portion of the source/drain contact 194.

In some embodiments, because the bottom portion of the opening O3 has been filled with the first metal 194A and the second metal 194B, the aspect ratio of the opening O3 is therefore reduced. Accordingly, due to the lowered aspect ratio of the opening O3, the third metal 194C may be filled in the opening O3 without void formation. Based on the processes discussed in FIGS. 11A and 12A, a first deposition-etch process is performed to form the void-free first metal 192A and 194A in the openings O2 and O3. Similarly, in FIGS. 14 and 15, a second deposition-etch process is performed to form the void-free second metal 192B and 194B in the openings O2 and O3 and over the first metal 192A and 194A, respectively. Finally, a deposition process is performed to form the third metal 192C and 194C in the openings O2 and O3. Embodiments of the present disclosure provide a method by cyclically performing a deposition-etch-deposition process to form source/drain contacts 192 and 194. The deposition-etch-deposition process allows the source/drain contacts 192 and 194 being formed, layer-by-layer, in a high aspect ratio opening (e.g., opening O3) through a bottom-up manner, which will improve the gap fill capability and may achieve a void-free gap filling process.

As mentioned above, during the etching back process of FIG. 15, materials of the etchants may be present at the etched surfaces of the second metals 192B and 194B. As a result, the materials of the etchants may be present at the interface between the second metal 192B and the third metal 192C, and at the interface between the second metal 194B and the third metal 194C. For example, oxygen ($O_2$), hydrogen ($H_2$), halogen element (e.g., $Cl_2$ or I) may be detected at the interface between the second metal 192B and the third metal 192C, and at the interface between the second metal 194B and the third metal 194C.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide a CFET, which includes a first transistor and a second transistor above the first transistor. An opening having a high aspect ratio is formed connecting the source/drain epitaxy structures of the first and second transistors. Embodiments of the present disclosure provide a method by cyclically performing a deposition-etch-deposition process to form a source/drain contact in the opening. The deposition-etch-deposition process allows the source/drain contact being formed, layer-by-layer, in a high aspect ratio opening through a bottom-up manner, which will improve the gap fill capability and may achieve a void-free gap filling process.

In some embodiments of the present disclosure, a method includes forming a first transistor over a substrate, in which the first transistor includes a first semiconductor channel layer, a first gate structure wrapping around the first semiconductor channel layer, and first source/drain epitaxy structures on opposite ends of the first semiconductor channel layer; forming a second transistor over the first transistor, in which the second transistor includes a second semiconductor channel layer, a second gate structure wrapping around the second semiconductor channel layer, and second source/drain epitaxy structures on opposite ends of the second semiconductor channel layer; forming an opening extending through one of the second source/drain epitaxy structures and exposing a top surface of one of the first source/drain epitaxy structures; performing a first deposition process to form a first metal in the opening, in which a first void is formed in the first metal during the first deposition process; performing a first etching back process to the first metal until the first void is absent; and performing a second deposition process to form a second metal in the opening and over the first metal.

In some embodiments, the method further includes forming an interlayer dielectric layer over the one of the first source/drain epitaxy structures, in which the interlayer dielectric layer is below the one of the second source/drain epitaxy structures, and in which the first void is at a portion of the opening within the interlayer dielectric layer.

In some embodiments, the method further includes prior to performing the first deposition process, forming silicide layers in the opening, in which the silicide layers have higher deposition rate on the one of the second source/drain epitaxy structures than on the interlayer dielectric layer.

In some embodiments, after the silicide layers are formed, the opening has a first portion within the interlayer dielectric layer and a second portion within the one of the second source/drain epitaxy structures, and in which the second portion is narrower than the first portion in a cross-sectional view.

In some embodiments, the silicide layers are formed through a chemical vapor deposition process.

In some embodiments, a sidewall of the interlayer dielectric layer remains exposed to the opening after the silicide layers are formed.

In some embodiments, a second void is formed in the second metal during the second deposition process, and the method further includes performing a second etching back process to the second metal until the second void is absent; and performing a third deposition process to form a third metal in the opening and over the second metal.

In some embodiments of the present disclosure, a method includes forming a first transistor over a substrate; forming a first isolation structure over a first source/drain epitaxy structure of the first transistor, in which the first isolation structure includes a first etch stop layer and a first interlayer dielectric layer over the first etch stop layer; forming a second transistor over the first transistor; performing an etching process to form an opening extending through a second source/drain epitaxy structure of the second transistor and the first isolation structure, and exposing the first source/drain epitaxy structure, in which the first interlayer dielectric layer of the first isolation structure is exposed to the opening; forming silicide layers in the opening, in which the silicide layers have higher deposition rate on the first and second source/drain epitaxy structures than on the first interlayer dielectric layer of the first isolation structure, such that after the silicide layers are formed, a first portion of the opening within the first isolation structure is wider than a second portion of the opening within the second source/drain epitaxy structure; performing a first deposition process to form a first metal in the opening; performing a first etching back process to the first metal until the etched first metal is void-free; and performing a second deposition process to form a second metal in the opening and over the etched first metal.

In some embodiments, a void is formed in the first metal during the first deposition process.

In some embodiments, the method further includes forming a second isolation structure over the second source/drain epitaxy structure of the second transistor, in which the second isolation structure includes a second etch stop layer and a second interlayer dielectric layer over the second etch stop layer, in which the second etch stop layer of the second isolation structure is exposed to the opening, and in which the silicide layers have higher deposition rate on the second etch stop layer of the second isolation structure than on the first interlayer dielectric layer of the first isolation structure.

In some embodiments, the first interlayer dielectric layer of the first isolation structure is made of oxide, while the second etch stop layer of the second isolation structure is made of nitride.

In some embodiments, the first metal is in contact with the first interlayer dielectric layer of the first isolation structure, while the second metal is spaced apart from the second etch stop layer of the second isolation structure through the silicide layers.

In some embodiments, the method further includes forming a second interlayer dielectric layer over the second transistor, in which the opening is formed through the second interlayer dielectric layer, and in which the silicide layers have higher deposition rate on the first and second source/drain epitaxy structures than on the second interlayer dielectric layer, such that a third portion of the opening within the second interlayer dielectric layer is wider than the second portion of the opening within the second source/drain epitaxy structure.

In some embodiments, the first etching back process includes a dry etch using $Cl_2/O_2$, $O_2/H_2$, or $O_3$; or a wet etch using $H_5IO_6$.

In some embodiments, the method further includes performing a second etching back process to the second metal until the etched second metal is void-free; and performing a third deposition process to form a third metal in the opening and over the etched second metal.

In some embodiments of the present disclosure, a semiconductor device includes a first transistor, a second transistor, an isolation structure, and a source/drain contact. The first transistor includes a first semiconductor channel layer, a first gate structure wrapping around the first semiconductor channel layer, and first source/drain epitaxy structures on opposite ends of the first semiconductor channel layer. The second transistor is vertically stacked over the first transistor and includes a second semiconductor channel layer, a second gate structure wrapping around the second semiconductor channel layer, and second source/drain epitaxy structures on opposite ends of the second semiconductor channel layer. The isolation structure is between one of the first source/drain epitaxy structures and one of the second source/drain epitaxy structures. The source/drain contact extends through the one of the second source/drain epitaxy structures and the isolation structure, and in contact with the one of the first source/drain epitaxy structures, the source/drain contact including a first portion and a second portion over the first portion, in which oxygen (O), hydrogen (H), chlorine (CI), or iodine (I) is present at an interface between the first and second portions of the source/drain contact.

In some embodiments, the interface between the first and second portions of the source/drain contact is lower than a bottom surface of the one of the second source/drain epitaxy structures and higher than a top surface of the one of the first source/drain epitaxy structures.

In some embodiments, the semiconductor device further includes silicide layers lining sidewalls of the one of the second source/drain epitaxy structures, in which the source/drain contact is in contact with the isolation structure and is spaced apart from the one of the second source/drain epitaxy structures through the silicide layers.

In some embodiments, the first portion of the source/drain contact is wider than the second portion of the source/drain contact.

In some embodiments, the source/drain contact is made of ruthenium (Ru), and a grain size of the source/drain contact is in a range from about 20 nm to about 40 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first transistor over a substrate, wherein the first transistor comprises a first semiconductor channel layer, a first gate structure wrapping around the first semiconductor channel layer, and first source/drain epitaxy structures on opposite ends of the first semiconductor channel layer;
    forming a second transistor over the first transistor, wherein the second transistor comprises a second semiconductor channel layer, a second gate structure wrapping around the second semiconductor channel layer, and second source/drain epitaxy structures on opposite ends of the second semiconductor channel layer;
    forming an opening extending through one of the second source/drain epitaxy structures and exposing a top surface of one of the first source/drain epitaxy structures;
    performing a first deposition process to form a first metal in the opening, wherein a first void is formed in the first metal during the first deposition process;
    performing a first etching back process to the first metal until the first void is absent; and
    performing a second deposition process to form a second metal in the opening and over the first metal.

2. The method of claim 1, further comprising forming an interlayer dielectric layer over the one of the first source/drain epitaxy structures, wherein the interlayer dielectric layer is below the one of the second source/drain epitaxy structures, and wherein the first void is at a portion of the opening within the interlayer dielectric layer.

3. The method of claim 2, further comprising prior to performing the first deposition process, forming silicide layers in the opening, wherein the silicide layers have higher deposition rate on the one of the second source/drain epitaxy structures than on the interlayer dielectric layer.

4. The method of claim 3, wherein after the silicide layers are formed, the opening has a first portion within the interlayer dielectric layer and a second portion within the one of the second source/drain epitaxy structures, and wherein the second portion is narrower than the first portion in a cross-sectional view.

5. The method of claim 3, wherein the silicide layers are formed through a chemical vapor deposition process.

6. The method of claim 3, wherein a sidewall of the interlayer dielectric layer remains exposed to the opening after the silicide layers are formed.

7. The method of claim 1, wherein a second void is formed in the second metal during the second deposition process, and the method further comprises:
    performing a second etching back process to the second metal until the second void is absent; and
    performing a third deposition process to form a third metal in the opening and over the second metal.

8. A method, comprising:
    forming a first transistor over a substrate;
    forming a first isolation structure over a first source/drain epitaxy structure of the first transistor, wherein the first isolation structure comprises a first etch stop layer and a first interlayer dielectric layer over the first etch stop layer;
    forming a second transistor over the first transistor;
    performing an etching process to form an opening extending through a second source/drain epitaxy structure of the second transistor and the first isolation structure, and exposing the first source/drain epitaxy structure, wherein the first interlayer dielectric layer of the first isolation structure is exposed to the opening;
    forming silicide layers in the opening, wherein the silicide layers have higher deposition rate on the first and second source/drain epitaxy structures than on the first interlayer dielectric layer of the first isolation structure, such that after the silicide layers are formed, a first portion of the opening within the first isolation structure is wider than a second portion of the opening within the second source/drain epitaxy structure;
    performing a first deposition process to form a first metal in the opening;
    performing a first etching back process to the first metal until the etched first metal is void-free; and
    performing a second deposition process to form a second metal in the opening and over the etched first metal.

9. The method of claim 8, wherein a void is formed in the first metal during the first deposition process.

10. The method of claim 8, further comprising forming a second isolation structure over the second source/drain epitaxy structure of the second transistor, wherein the second isolation structure comprises a second etch stop layer and a second interlayer dielectric layer over the second etch stop layer, wherein the second etch stop layer of the second isolation structure is exposed to the opening, and wherein the silicide layers have higher deposition rate on the second etch stop layer of the second isolation structure than on the first interlayer dielectric layer of the first isolation structure.

11. The method of claim 10, wherein the first interlayer dielectric layer of the first isolation structure is made of oxide, while the second etch stop layer of the second isolation structure is made of nitride.

12. The method of claim 10, wherein the first metal is in contact with the first interlayer dielectric layer of the first isolation structure, while the second metal is spaced apart from the second etch stop layer of the second isolation structure through the silicide layers.

13. The method of claim 8, further comprising forming a second interlayer dielectric layer over the second transistor, wherein the opening is formed through the second interlayer dielectric layer, and wherein the silicide layers have higher deposition rate on the first and second source/drain epitaxy structures than on the second interlayer dielectric layer, such that a third portion of the opening within the second interlayer dielectric layer is wider than the second portion of the opening within the second source/drain epitaxy structure.

14. The method of claim 8, wherein the first etching back process comprises:
a dry etch using $Cl_2/O_2$, $O_2/H_2$, or $O_3$; or
a wet etch using $H_5IO_6$.

15. The method of claim 8, further comprising:
performing a second etching back process to the second metal until the etched second metal is void-free; and
performing a third deposition process to form a third metal in the opening and over the etched second metal.

16. A semiconductor device, comprising:
a first transistor, comprising:
a first semiconductor channel layer;
a first gate structure wrapping around the first semiconductor channel layer; and
first source/drain epitaxy structures on opposite ends of the first semiconductor channel layer; and
a second transistor vertically stacked over the first transistor, comprising:
a second semiconductor channel layer;
a second gate structure wrapping around the second semiconductor channel layer; and
second source/drain epitaxy structures on opposite ends of the second semiconductor channel layer; and
an isolation structure between one of the first source/drain epitaxy structures and one of the second source/drain epitaxy structures; and
a source/drain contact extending through the one of the second source/drain epitaxy structures and the isolation structure, and in contact with the one of the first source/drain epitaxy structures, the source/drain contact comprising a first portion and a second portion over the first portion, wherein oxygen (O), hydrogen (H), chlorine (Cl), or iodine (I) is present at an interface between the first and second portions of the source/drain contact.

17. The semiconductor device of claim 16, wherein the interface between the first and second portions of the source/drain contact is lower than a bottom surface of the one of the second source/drain epitaxy structures and higher than a top surface of the one of the first source/drain epitaxy structures.

18. The semiconductor device of claim 16, further comprising silicide layers lining sidewalls of the one of the second source/drain epitaxy structures, wherein the source/drain contact is in contact with the isolation structure and is spaced apart from the one of the second source/drain epitaxy structures through the silicide layers.

19. The semiconductor device of claim 16, wherein the first portion of the source/drain contact is wider than the second portion of the source/drain contact.

20. The semiconductor device of claim 16, wherein the source/drain contact is made of ruthenium (Ru), and a grain size of the source/drain contact is in a range from about 20 nm to about 40 nm.

* * * * *